United States Patent
Son et al.

(10) Patent No.: US 11,729,972 B2
(45) Date of Patent: Aug. 15, 2023

(54) 3D MEMORY DEVICES

(71) Applicant: Samsung Electronics Co., Ltd., Suwon-si (KR)

(72) Inventors: Younghwan Son, Hwaseong-si (KR); Seogoo Kang, Seoul (KR); Jeehoon Han, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 278 days.

(21) Appl. No.: 16/844,429

(22) Filed: Apr. 9, 2020

(65) Prior Publication Data

US 2021/0036011 A1 Feb. 4, 2021

(30) Foreign Application Priority Data

Jul. 31, 2019 (KR) .......................... 10-2019-0093370

(51) Int. Cl.
| | | |
|---|---|---|
| *H10B 43/27* | (2023.01) | |
| *G11C 8/14* | (2006.01) | |
| *G11C 7/18* | (2006.01) | |
| *H01L 29/423* | (2006.01) | |
| *H01L 29/792* | (2006.01) | |
| *H10B 43/10* | (2023.01) | |
| *H01L 21/28* | (2006.01) | |

(52) U.S. Cl.
CPC ............... *H10B 43/27* (2023.02); *G11C 7/18* (2013.01); *G11C 8/14* (2013.01); *H01L 29/4234* (2013.01); *H01L 29/7926* (2013.01); *H10B 43/10* (2023.02); *H01L 29/40117* (2019.08)

(58) Field of Classification Search
CPC ......... H01L 27/11565; H01L 27/11582; H01L 29/4234; H01L 29/7926; H01L 29/40117; H10B 43/10; H10B 43/27
See application file for complete search history.

(56) References Cited

U.S. PATENT DOCUMENTS

| | | |
|---|---|---|
| 7,829,938 B2 | 11/2010 | Bhattacharyya |
| 7,927,953 B2 | 4/2011 | Ozawa |
| 8,058,118 B2 | 11/2011 | Bhattacharyya |
| (Continued) | | |

OTHER PUBLICATIONS

Noh, Y. et al. "Synaptic Devices Based on 3-D and Flash Memory Architecture for Neuromorphic Computing." 2019 IEEE 11th International Memory Workshop. May 1, 2019. (Year: 2019).*

(Continued)

*Primary Examiner* — Herve-Louis Y Assouman
*Assistant Examiner* — Christopher M Roland
(74) *Attorney, Agent, or Firm* — Harness, Dickey & Pierce, P.L.C.

(57) ABSTRACT

A semiconductor device is disclosed. The semiconductor device includes a channel structure on a substrate and extending in a first direction perpendicular to a top surface of the substrate; a plurality of gate electrodes on the substrate and spaced apart from one another in the first direction on a sidewall of the channel structure; and a gate insulating layer between each of the plurality of gate electrodes and the channel structure, wherein the channel structure includes a body gate layer extending in the first direction; a charge storage structure surrounding a sidewall of the body gate layer; and a channel layer surrounding sidewall of the charge storage structure.

20 Claims, 39 Drawing Sheets

(56) References Cited

U.S. PATENT DOCUMENTS

| | | |
|---|---|---|
| 9,576,971 B2 | 2/2017 | Zhang et al. |
| 9,716,102 B2 | 7/2017 | Kim et al. |
| 9,997,640 B2 | 6/2018 | Luo |
| 10,083,981 B2 | 9/2018 | Daycock et al. |
| 10,892,279 B1 * | 1/2021 | Sakotsubo ........ H01L 27/11582 |
| 2008/0116506 A1 | 5/2008 | Lue |
| 2011/0233644 A1 | 9/2011 | Fukuzumi et al. |
| 2013/0237047 A1 | 9/2013 | Nakao et al. |
| 2016/0163729 A1 | 6/2016 | Zhang et al. |
| 2019/0006386 A1 * | 1/2019 | Yamazaki ............. H01L 27/249 |
| 2020/0365613 A1 * | 11/2020 | Wang ................ H01L 27/11565 |
| 2021/0050359 A1 * | 2/2021 | Kai ................... H01L 27/11597 |
| 2021/0066344 A1 * | 3/2021 | Son ..................... H01L 29/4916 |
| 2022/0085058 A1 * | 3/2022 | Murakami ........ H01L 27/11519 |

OTHER PUBLICATIONS

Ranica et al., "New 40-nm SONOS Structure Based on Backside Trapping for Nanoscale Memories", IEEE Transactions on Nanotechnology, vol. 4, No. 5, Sep. 2005, p. 581-587.

* cited by examiner

3D MEMORY DEVICES

CROSS-REFERENCE TO RELATED APPLICATION

This application claims the benefit of Korean Patent Application No. 10-2019-0093370, filed on Jul. 31, 2019, in the Korean Intellectual Property Office, the disclosure of which is incorporated herein in its entirety by reference.

BACKGROUND

The inventive concepts relate to semiconductor devices and methods of operating the same, and more particularly, to semiconductor devices including a channel structure extending in a vertical direction, methods of operating the same and methods of manufacturing the same.

As the degree of integration of memory devices increases, memory devices having vertical transistor structures are being proposed, instead of memory devices having conventional planar transistor structures. Memory devices having vertical transistor structures may include a channel structure that extends in a vertical direction on a substrate. However, as the degree of integration of memory devices increases, the number of gate electrode layers stacked in the vertical direction increases, and thus processes for manufacturing the memory devices become increasingly difficult.

SUMMARY

The inventive concepts provide semiconductor devices that may have improved electrical characteristics while having a high vertical height.

The inventive concepts provide methods of operating a semiconductor device that may have improved electrical characteristics while having a high vertical height.

According to an aspect of the inventive concepts, there is provided a semiconductor device including: a channel structure on a substrate and extending in a first direction perpendicular to a top surface of the substrate, the channel structure including a body gate layer extending in the first direction, a charge storage structure surrounding a sidewall of the body gate layer, and a channel layer surrounding a sidewall of the charge storage structure; a plurality of gate electrodes on the substrate and spaced apart from one another in the first direction on a sidewall of the channel structure; and a gate insulating layer between each of the plurality of gate electrodes and the channel structure.

According to another aspect of the inventive concepts, there is provided a semiconductor device including: a plurality of gate electrodes on a substrate and spaced apart from one another in a first direction perpendicular to a top surface of the substrate; a channel structure in a channel hole penetrating the plurality of gate electrodes and extending in the first direction, the channel structure including channel layer on an inner wall of the channel hole and a charge storage structure on the channel layer on the inner wall of the channel hole; a gate insulating layer between each of the plurality of gate electrodes and the channel layer, and covering a top surface and a bottom surface of each of the plurality of gate electrodes, and wherein the channel layer is between each of the plurality of gate electrodes and the charge storage structure.

According to another aspect of the inventive concepts, there is provided a semiconductor device including: a channel structure on a substrate and extending in a first direction perpendicular to a top surface of the substrate, the channel structure including a body gate layer extending in the first direction, a charge storage structure surrounding a sidewall of the body gate layer, and a channel layer surrounding a sidewall of the charge storage structure; a plurality of gate electrodes on the substrate and spaced apart from one another in the first direction on a sidewall of the channel structure; a gate insulating layer between each of the plurality of gate electrodes and the channel structure; a bit line pad formed at a level higher than an uppermost gate electrode of the plurality of gate electrodes and on the channel layer; a bit line contact connected to the bit line pad; and a bit line connected to the bit line contact and extending in a second direction parallel to the top surface of the substrate.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Hereinafter, example embodiments of the inventive concept will be described in detail with reference to the accompanying drawings.

It will be understood that an element that is "on" another element may be above or below the other element. It will be further understood that an element that is "on" another element may be "directly" on the other element, such that the elements are in direct contact with each other, or may be "indirectly" on the other element, such that the elements are isolated from direct contact with each other by one or more interposing spaces and/or structures.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Figure 1:
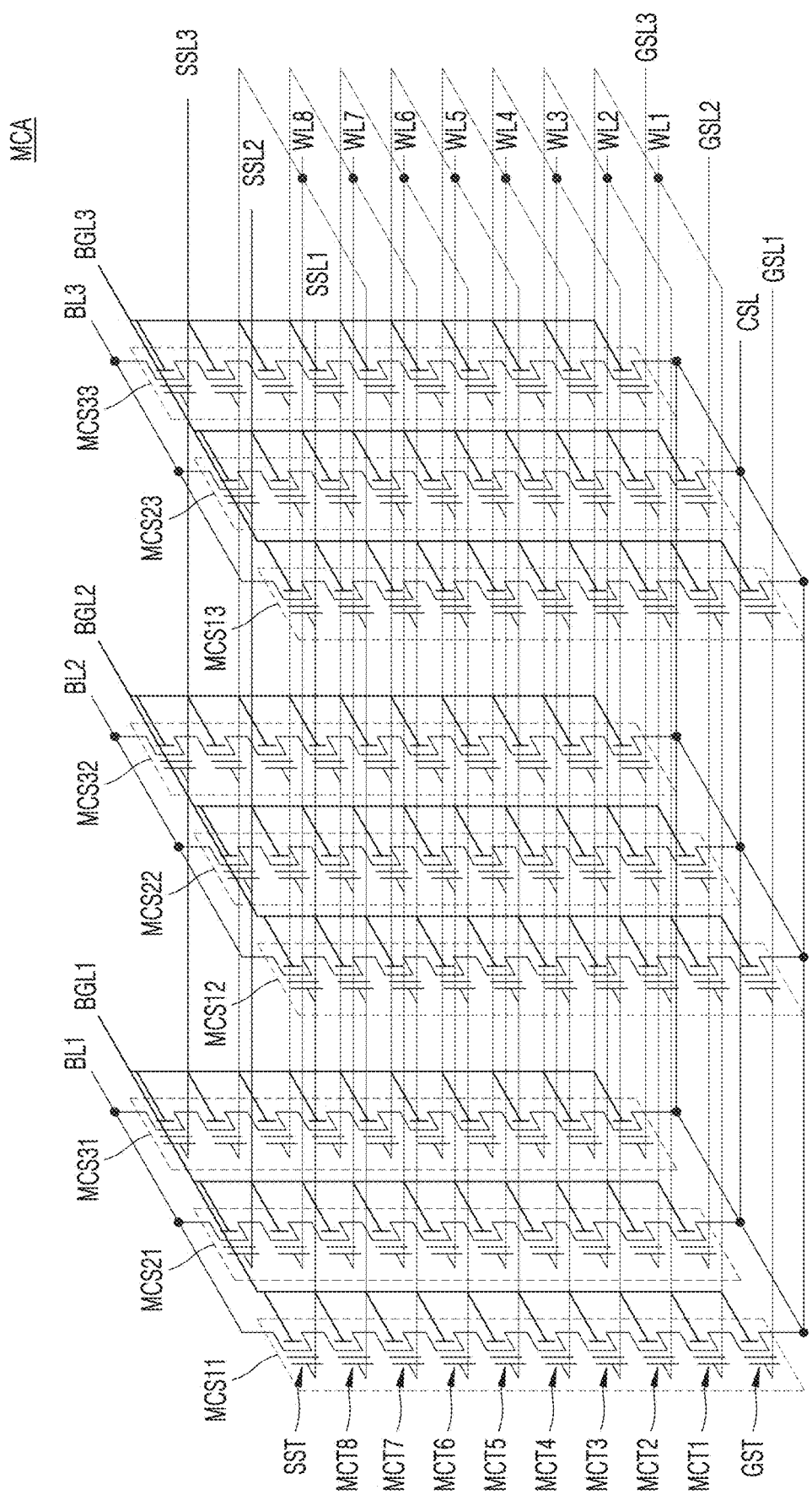
FIG. 1 is an equivalent circuit diagram of a memory cell array of a semiconductor device according to some example embodiments.

FIG. 1 is an equivalent circuit diagram of a memory cell array (MCA) of a semiconductor device according to some example embodiments, in particular, an equivalent circuit diagram of a vertical NAND (VNAND) flash memory device having a vertical channel structure.

Referring to FIG. 1, the memory cell array MCA may include memory cell strings MCS11 to MCS33, word lines WL1 to WL8, ground select lines GSLs, string select lines SSL1 to SSL3, and a common source line CSL.

The memory cell strings MCS11, MCS21, and MCS31 may be provided between a first bit line BL1, a first body gate line BGL1, and the common source line CSL, and the memory cell strings MCS12, MCS22, and MCS32 may be provided between a second bit line BL2, a second body gate line BGL2, and the common source line CSL, and the memory cell strings MCS13, MCS23, and MCS33 may be provided between a third bit line BL3, a third body gate line BGL3, and the common source line CSL. Each of memory cell strings (e.g., MCS11) may include a string select transistor SST, a plurality of memory cells MCT1 to MCT8, and a ground select transistor GST connected in series.

The string select transistor SST may be connected to the corresponding string select lines SSL1 to SSL3. The plurality of memory cells MCT1 to MCT8 may be respectively connected to the corresponding word lines WL1 to WL8. The ground select transistor GST may be connected to the corresponding ground select lines GSL1 to GSL3. The string select transistor SST may be connected to the corresponding bit lines BL1 to BL3, and the ground select transistor GST may be connected to the common source line CSL.

In some example embodiments, word lines of the same height (for example, WL1) may be connected to each other in common, the string select lines SSL1 to SSL3 may be separated from each other, and the ground select lines GSL1 to GSL3 may be also separated from each other. FIG. 1 illustrates that three string selection lines SSL1 to SSL3 share a word line of the same height, but the inventive concept is not limited thereto. In some examples, two string select lines may share a word line of the same height. In other examples, four string select lines may share a word line of the same height.

Figure 2:
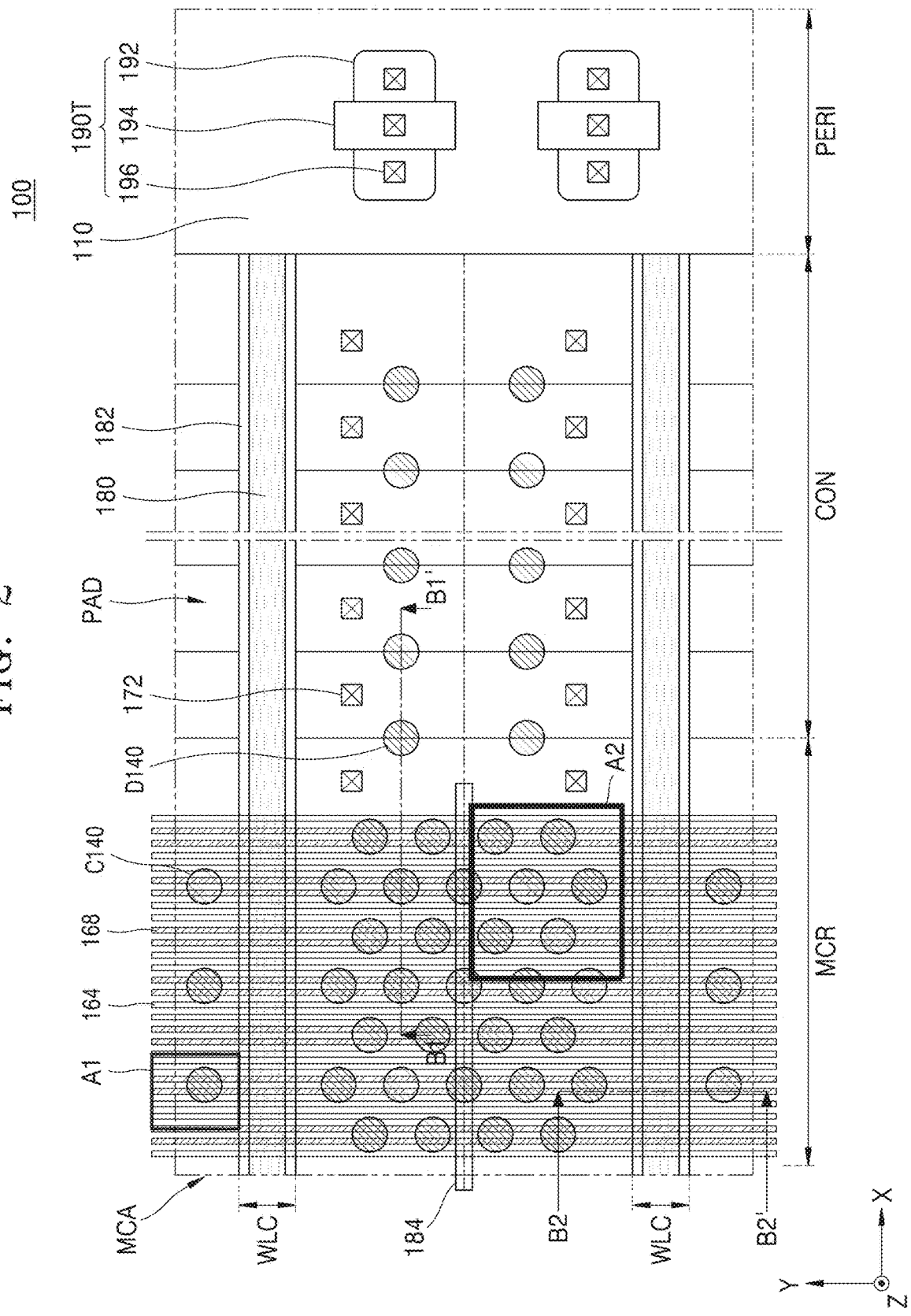
FIG. 2 is a plan view illustrating a representative configuration of a semiconductor device according to some example embodiments.
Figure 3:
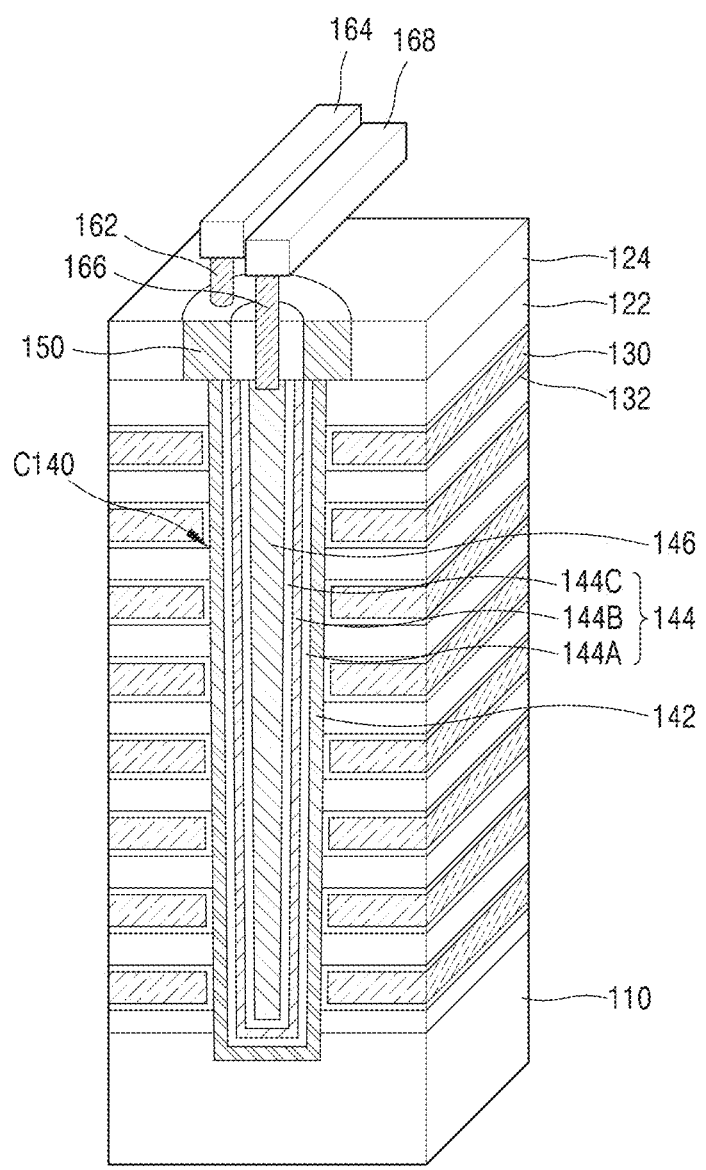
FIG. 3 is a schematic perspective view of a portion A1 of FIG. 2.
Figure 4A:
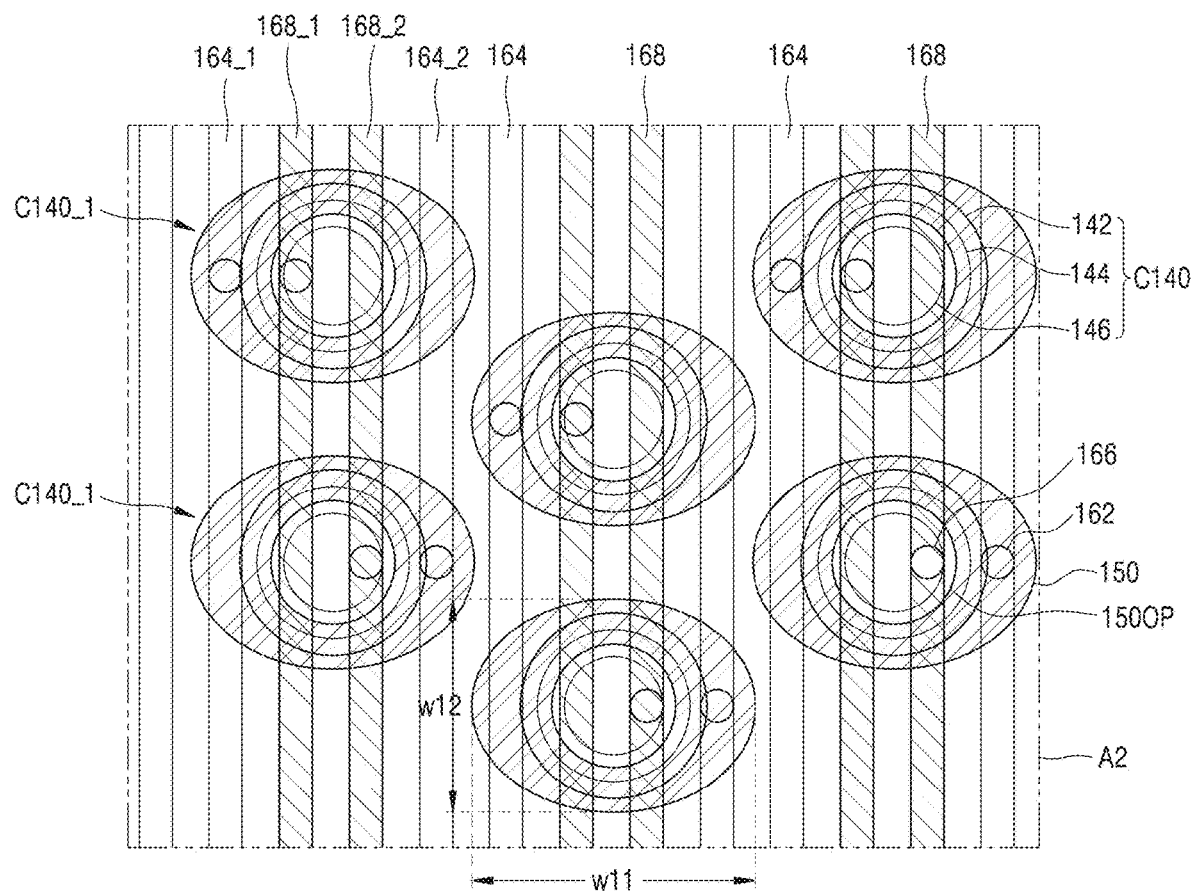
FIGS. 4A and 4B are enlarged plan views of a portion A2 of FIG. 2.
Figure 4B:
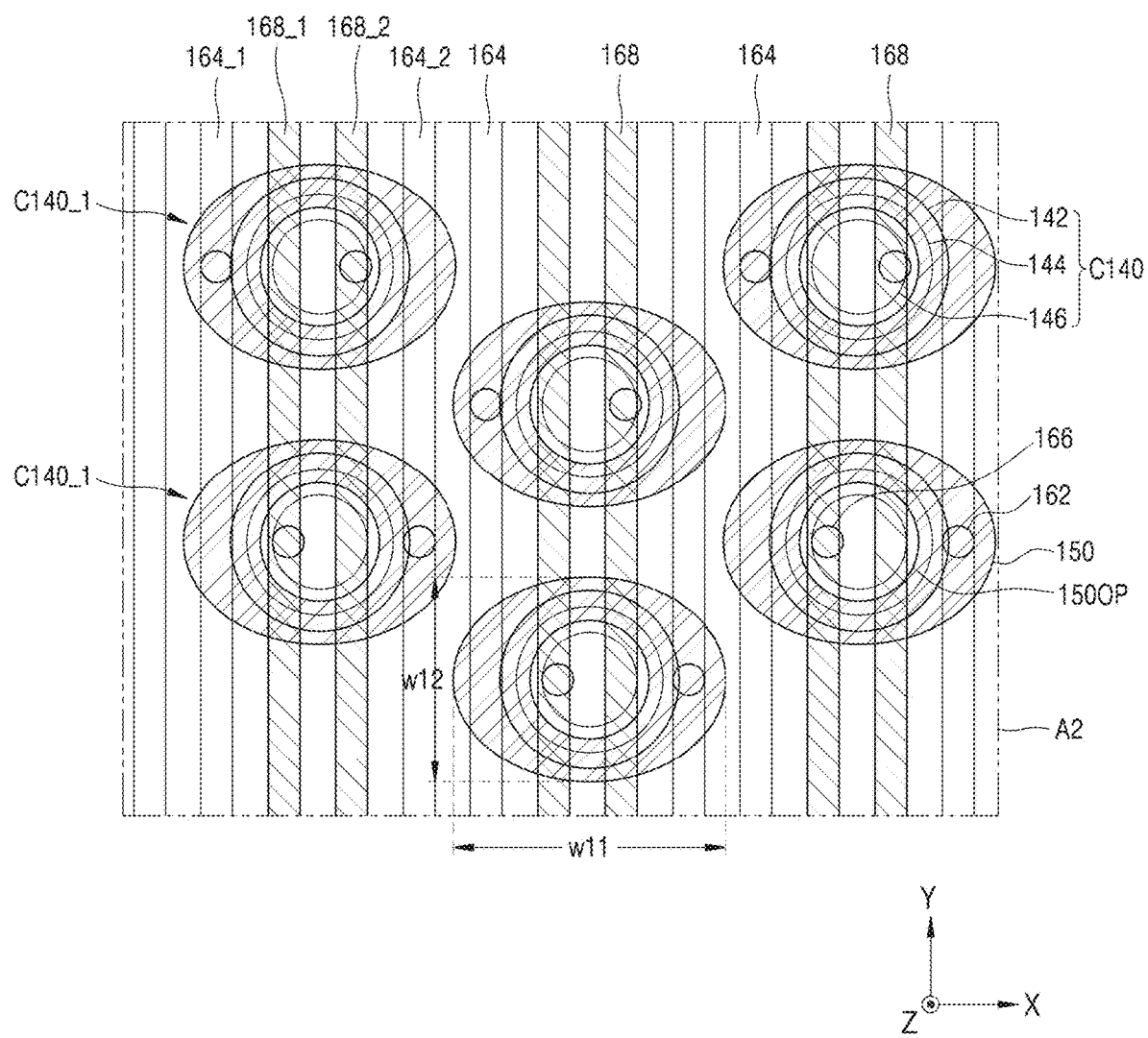
Figure 5:
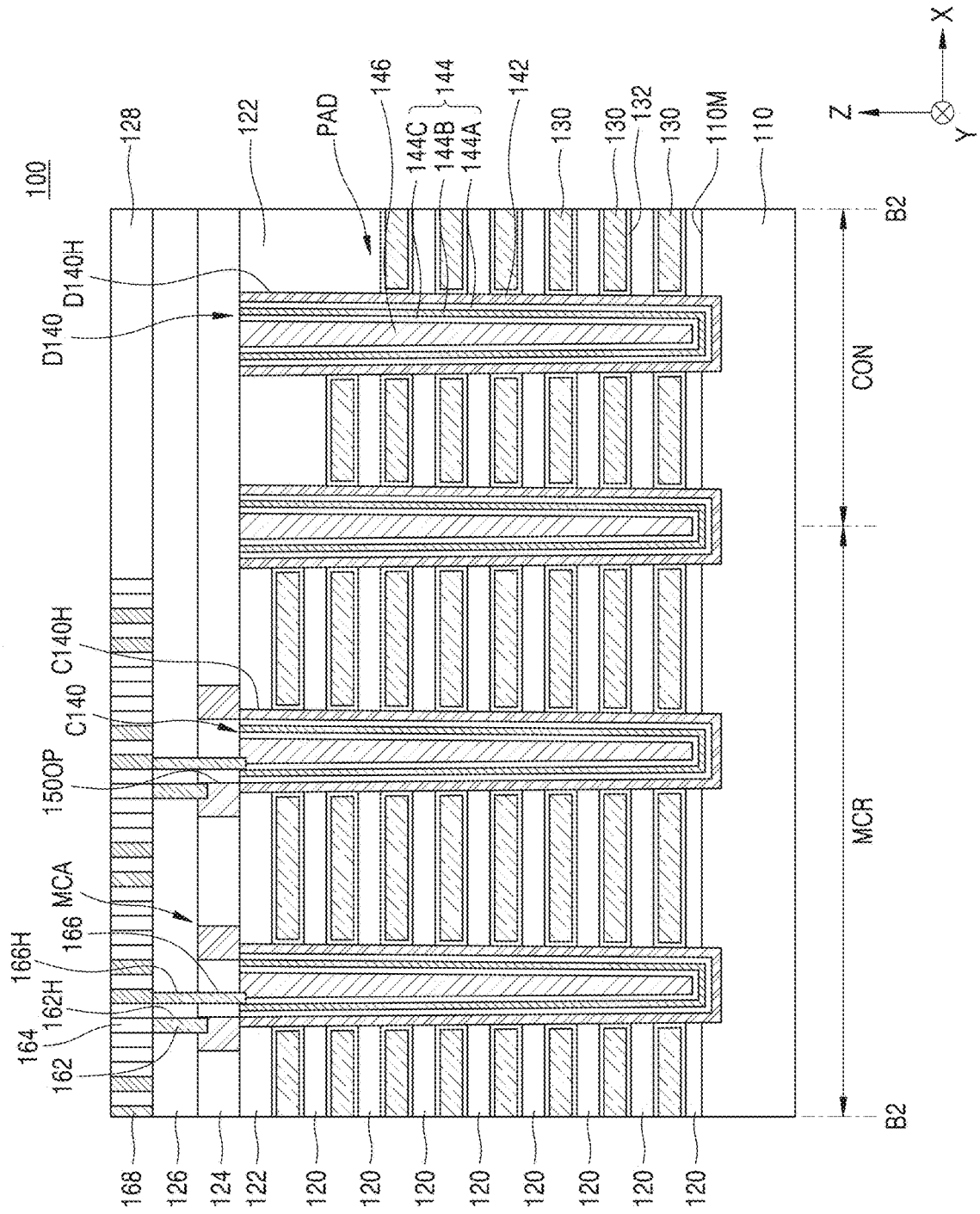
FIG. 5 is a cross-sectional view taken along a line B1-B1' of FIG. 2.
Figure 6:
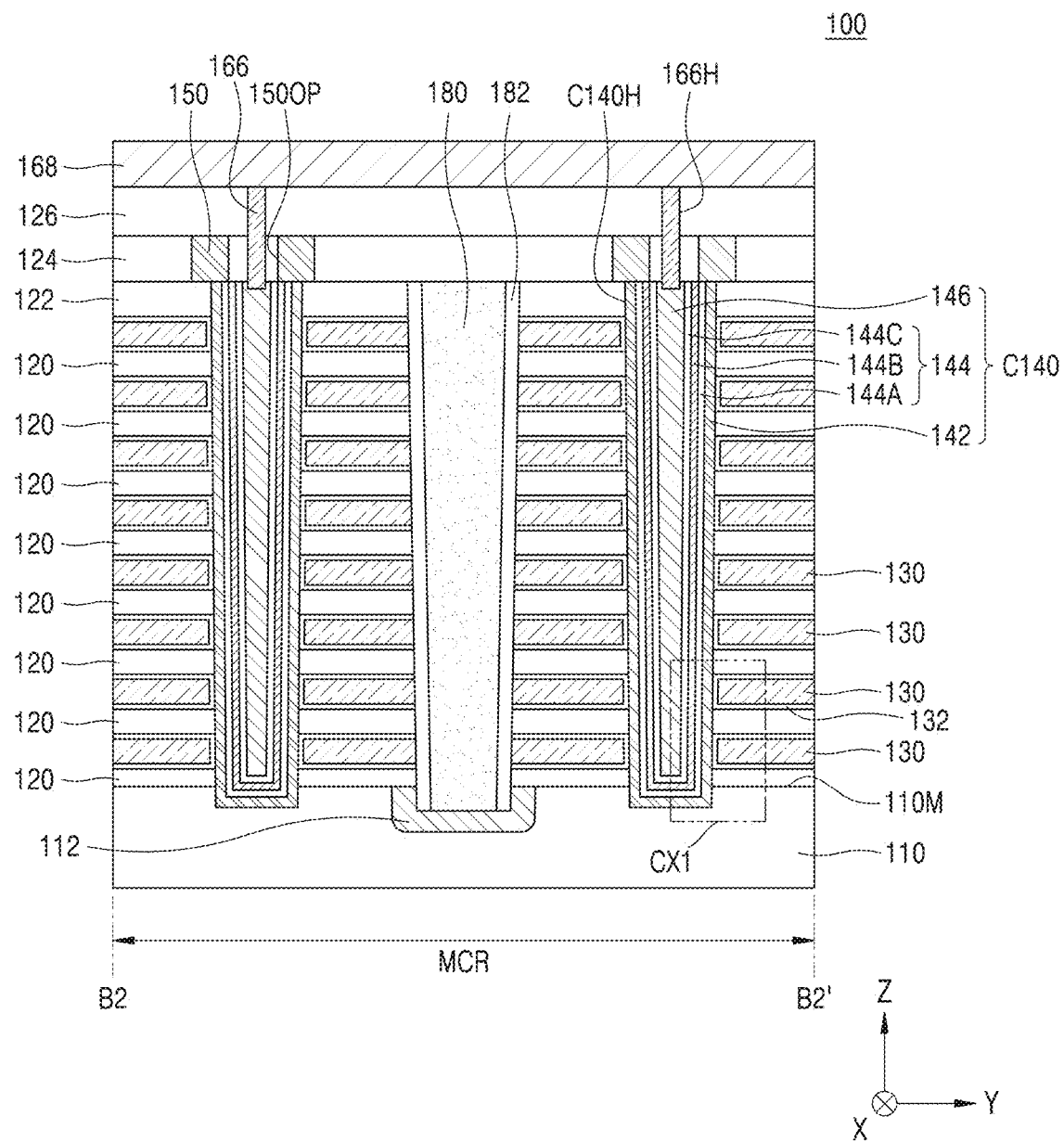
FIG. 6 is a cross-sectional view taken along a line B2-B2' of FIG. 2.
Figure 7:
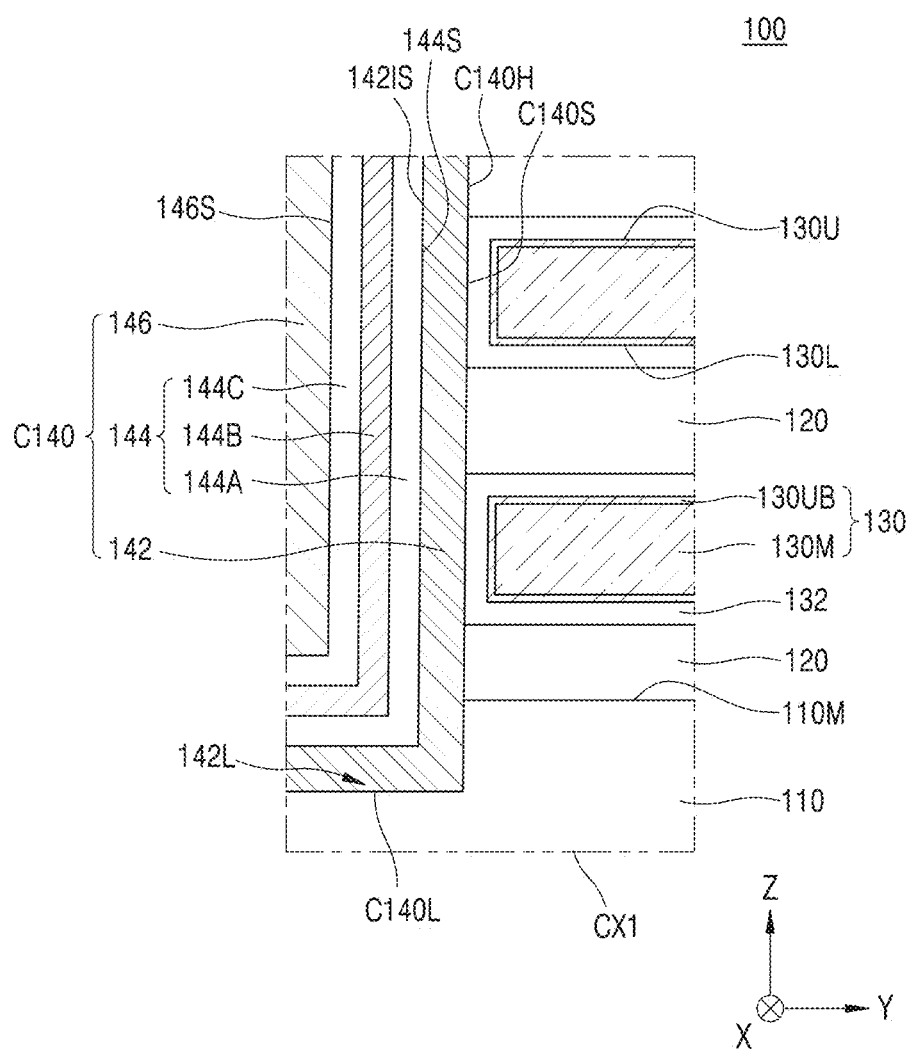
FIG. 7 is an enlarged view of a portion CX1 of FIG. 6.

FIG. 2 is a plan view illustrating a representative configuration of a semiconductor device 100 according to some example embodiments. FIG. 3 is a schematic perspective view of a portion A1 of FIG. 2, and FIGS. 4A and 4B are enlarged plan views of a portion A2 of FIG. 2. FIG. 5 is a cross-sectional view taken along a line B1-B1' of FIG. 2, FIG. 6 is a cross-sectional view taken along a line B2-B2' of FIG. 2, and FIG. 7 is an enlarged view of a portion CX1 of FIG. 6. In FIGS. 2 to 4B, only a portion of components of the semiconductor device 100 are schematically illustrated for convenience of illustration and understanding.

Referring to FIGS. 2 to 7, a substrate 110 may include a memory cell region MCR, a connection region CON, and a peripheral circuit region PERI. The memory cell array MCA may be disposed on the memory cell region MCR, and the memory cell array MCA may include a NAND memory device having a vertical channel structure, the NAND memory device being driven in the manner described with reference to FIG. 1. A peripheral circuit transistor 190T for driving the memory cell array MCA may be disposed on the peripheral circuit region PERI. The peripheral circuit transistor 190T may include a peripheral circuit active region 192, a peripheral circuit gate electrode 194 disposed on the peripheral circuit active region 192, and a peripheral circuit contact 196 connected to the peripheral circuit active region 192 and the peripheral circuit gate electrode 194. The connection area CON may be an area in which a pad part PAD for connecting the memory cell array MCA disposed in the memory cell area MCR to the peripheral circuit transistor 190T is formed.

The substrate 110 may include a main surface 110M extending in a first direction (X direction) and a second direction (Y direction). The substrate 110 may include a semiconductor material, for example, a group IV semiconductor, a group III-V compound semiconductor, or a group II-VI oxide semiconductor. For example, the group IV semiconductor may include silicon (Si), germanium (Ge), and/or silicon-germanium. The substrate 110 may include a bulk wafer or an epitaxial layer. In some example embodiments, the substrate 110 may include a silicon-on-insulator (SOI) substrate or a germanium-on-insulator (GeOI) substrate.

On the memory cell region MCR of the substrate 110, a plurality of first insulating layers 120 and a plurality of gate electrodes 130 may be alternately arranged in a third direction (Z direction) perpendicular to the main surface 110M of the substrate 110. For example, the first insulating layer 120 and the gate electrode 130 may be alternately and repeatedly arranged on the substrate 110. A second insulating layer 122 may be disposed on an uppermost gate electrode 130.

The plurality of gate electrodes 130 may include a metal layer 130M and a conductive barrier layer 130UB surrounding top, bottom, and side surfaces of the metal layer 130M. The conductive barrier layer 130UB may include titanium nitride (TiN), tantalum nitride (TaN), tungsten nitride (WN), ruthenium (Ru), titanium (Ti), tantalum (Ta), and/-or combinations thereof. The metal layer 130M may include at least one of cobalt (Co), tungsten (W), nickel (Ni), ruthenium (Ru), copper (Cu), aluminum (Al), silicides thereof, and/or alloys thereof. In some example embodiments, each of the plurality of gate electrodes 130 may have a thickness of about 1 nm to about 30 nm in the third direction (Z direction), or about 1 nm to about 15 nm, or about 15 nm to about 30 nm, or about 15 nm. However, the thickness of each of the plurality of gate electrodes 130 is not limited thereto.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

In some example embodiments, the plurality of gate electrodes 130 may correspond to the ground select lines GSL1 to GSL3, the word lines WL1 to WL8, and the string select lines SSL1 to SSL3 constituting the memory cell strings MCS11 to MCS33 (see FIG. 1). For example, a lowermost gate electrode 130 may function as the ground select lines GSL1 to GSL3, the uppermost gate electrode 130 may function as the string select lines SSL1 to SSL3, and the remaining gate electrodes 130 may function as the word lines WL1 to WL8. In some embodiments, the gate electrode 130 disposed directly below the uppermost gate electrode 130 or the gate electrode 130 disposed directly above the lowermost gate electrode 130 may function as a dummy word line. Accordingly, the memory cell strings MCS11 to MCS33 in which the ground select transistor GST, the select transistor SST and the memory cells MCT1 to MCT8 between the ground select transistor GST and the select transistor SST are connected in series may be provided.

A plurality of channel structures C140 may extend in the third direction (Z direction) from the main surface 110M of the substrate 110 in the memory cell region MCR while penetrating the plurality of gate electrodes 130. The plurality of channel structures C140 may be spaced apart from each other at desired (or, alternatively predetermined) intervals in the first direction (X direction), the second direction (Y direction), and a fourth direction (e.g., a diagonal direction). The plurality of channel structures C140 may be arranged in a zigzag shape or a staggered shape.

Each of the plurality of channel structures C140 may be disposed in a channel hole C140H penetrating the plurality of gate electrodes 130, the plurality of first insulating layers 120, and the second insulating layer 122. A channel layer 142, a charge storage structure 144, and a body gate layer 146 may be sequentially disposed on an inner wall of the channel hole C140H.

The channel layer 142 may be conformally formed on the inner wall of the channel hole C140H, and the channel layer 142 may include a bottom portion 142L contacting the substrate 110. The bottom portion 142L of the channel layer 142 (or a bottom surface C142L of the channel structure C140) may be disposed at a level lower than the main surface 110M of the substrate 110. For example, a bottom portion of the channel hole C140H may be recessed from the main surface 110M of the substrate 110, and the bottom portion 142L of the channel layer 142 may be disposed at the bottom portion of the channel hole C140H, and the bottom portion 142L of the channel layer 142 may be in contact with a top surface of the substrate 110 disposed at the bottom of the channel hole C140H.

The charge storage structure 144 may have a structure including a tunneling dielectric layer 144A, a charge storage layer 144B, and a blocking dielectric layer 144C sequentially formed on a sidewall 142IS of the channel layer 142. That is, the channel layer 142, the tunneling dielectric layer 144A, the charge storage layer 144B, and the blocking dielectric layer 144C may be sequentially disposed on the inner wall of the channel hole C140H. The relative thicknesses of the tunneling dielectric layer 144A, the charge storage layer 144B, and the blocking dielectric layer 144C including the charge storage structure 144 are not limited to those illustrated in FIG. 7 and may be variously modified.

In example embodiments, the tunneling dielectric layer 144A may include silicon oxide, hafnium oxide, aluminum oxide, zirconium oxide, tantalum oxide, and/or the like. The charge storage layer 144B may be a region in which electrons passing through the tunneling dielectric layer 144A from the channel layer 142 may be stored, and may include silicon nitride, boron nitride, silicon boron nitride, and/or doped polysilicon with impurities. The blocking dielectric layer 144C may include silicon oxide, silicon nitride, and/or metal oxide having a higher dielectric constant than that of silicon oxide. The metal oxide may include hafnium oxide, aluminum oxide, zirconium oxide, tantalum oxide, and/or combinations thereof.

The body gate layer 146 may fill a remaining space of the channel hole C140H on the charge storage structure 144. In example embodiments, the body gate layer 146 may include, but is not limited to, a doped polysilicon layer. When data writing operation, reading operation, or erasing operation of the memory cells MCT1 to MCT8 (see FIG. 1) are performed, a desired (or, alternatively predetermined) voltage (or signal) may be applied to the body gate layer 146 via the body gate lines BGL1 to BGL3 (see FIG. 1).

In example embodiments, the body gate layer 146 may have a pillar shape extending in the third direction (Z direction) in the channel hole C140H. A top surface of the body gate layer 146 may be disposed at a same level as a top surface of the second insulating layer 122, and a bottom surface of the body gate layer 146 may be disposed at a lower level than a bottom surface of the lowermost gate electrode 130. A sidewall 146S and the bottom surface of the body gate layer 146 may contact the charge storage structure 144. For example, as shown in FIG. 7, the charge storage structure 144 may surround the sidewall 146S of the body gate layer 146, and the channel layer 142 may surround an outer wall 144S of the charge storage structure 144. The gate electrode 130 may surround an outer wall of the channel layer 142, and an inner wall 142IS of the channel layer 142 may contact the outer wall 144S of the charge storage structure 144.

A gate insulating layer 132 may be between the gate electrode 130 and the channel structure C140. The gate insulating layer 132 may be between the gate electrode 130 and the channel layer 142 and between the gate electrode 130 and the first insulating layer 120, and may cover a top surface 130U and a bottom surface 130L of the gate electrode 130. In example embodiments, the gate insulating layer 132 may include, but is not limited to, silicon oxide.

A bit line pad 150 may be disposed on the channel structure C140, the bit line pad 150 being electrically connected to the channel layer 142. For example, as illustrated in FIG. 4A, the bit line pad 150 may have an annular shape, and an opening 150OP may be defined by an inner wall of the bit line pad 150. The bit line pad 150 may not vertically overlap the body gate layer 146, and thus the bit line pad 150 may not be electrically connected to the body gate layer 146. For example, in a plan view, an outer wall of the bit line pad 150 may have an oval shape, and an inner wall of the bit line pad 150 may have a circular shape. In the plan view, the inner wall of the bit line pad 150 (e.g., a boundary of the opening 150OP) may be arranged to surround the sidewall of the body gate layer 146 with a desired (or, alternatively predetermined) interval, and thus the bit line pad 150 and the body gate layer 146 may be spaced apart from each other. In some example embodiments, the outer wall of the bit line pad 150 may have at least one of a rounded rectangular shape, a polygonal shape, a circular shape, and an oval shape, and the inner wall of the bit line pad 150 may have at least one of a rounded rectangular shape, a polygonal shape, a circular shape, and an oval shape.

A third insulating layer 124 may be disposed on the second insulating layer 122, and the third insulating layer 124 may surround a sidewall of the bit line pad 150 and may be disposed at the same vertical level as the bit line pad 150. A fourth insulating layer 126 may be disposed on the third insulating layer 124.

A plurality of bit lines 164 may extend in the second direction (Y direction) on the fourth insulating layer 126. A bit line contact 162 may be disposed in a bit line contact hole 162H penetrating the fourth insulating layer 126, and the bit line contact 162 may electrically connect the bit line pad 150 to the bit line 164. A plurality of body gate lines 168 may extend in the second direction (Y direction) on the fourth insulating layer 126. A body gate contact 166 may be disposed in a body gate contact hole 166H penetrating the fourth insulating layer 126 and the third insulating layer 124, and the body gate contact 166 may electrically connect the body gate line 168 to the body gate layer 146. A fifth insulating layer 128 may be disposed on the fourth insulating layer 126 to surround sidewalls of the plurality of bit lines 164 and the plurality of body gate lines 168.

In example embodiments, as shown in FIG. 4A, the bit line contact 162 may be offset or apart from a center of the channel structure C140, for example, in the first direction (X direction). The bit line pad 150 may have a first width w11 in the first direction (X direction) and a second width w12 smaller than the first width w11 in the second direction (Y direction). Accordingly, the bit line contact 162 may be disposed on the bit line pad 150 (e.g., at a position farther away from the center of the channel structure C140), and the body gate contact 166 may be disposed on the body gate layer 146 (e.g., at a position spaced closer than the bit line contact 162 from the center of the channel structure C140), and the plurality of body gate lines 168 may be disposed at a same level as the plurality of bit lines 164. Two bit lines 164 disposed side by side may be alternately and repeatedly arranged with two body gate lines 168 disposed side by side.

In example embodiments, as shown in FIG. 4A, when two channel structures C140 may be disposed in the second direction (Y direction) between a string isolation layer 184 and a word line cut region WLC, a first bit line 164_1 and a first body gate line 168_1 connected to a first channel structure C140_1 which is one of the two channel structures C140, and the second bit line 164_2 and the second body gate line 168_2 connected to a second channel structure C140_2 which is the other of the two channel structures C140, may extend in the second direction (Y direction) in parallel with each other. Accordingly, the first bit line 164_1, the first body gate line 168_1, the second body gate line 168_2, and the second bit line 164_2 may be sequentially disposed in the first direction (X direction).

In some example embodiments, as illustrated in FIG. 4B, a first bit line 164_1 and a first body gate line 168_1 connected to a first channel structure C140_1 which is one of the two channel structures C140 disposed side by side in the second direction (Y direction), and the second bit line 164_2 and the second body gate line 168_2 connected to a second channel structure C140_2 which is the other of the two channel structures C140, may extend in the second direction (Y direction) in parallel with each other, wherein the first bit line 164_1, the second body gate line 168_2, the first body gate line 168_1, and the second bit line 164_2 may be sequentially disposed in the first direction (X direction). In this case, a separation distance between the first bit line contact 162 connected to the first bit line 164_1 and the first body gate contact 166 connected to the first body gate line 168_1 may be relatively large, and thus the process margin in processes for forming the bit line contact hole 162H and the body gate contact hole 166H may be increased.

In still some example embodiments, unlike those shown in FIGS. 4A and 4B, the plurality of body gate lines 168 may extend in the second direction (Y direction) at a different vertical level than the plurality of bit lines 164, respectively.

As illustrated in FIG. 2, a plurality of word line cut regions WLC may extend in the first direction (X direction) parallel to the main surface 110M of the substrate 110 on the substrate 110. A plurality of gate electrodes 130 disposed between one pair of word line cut regions WLC may constitute one block, and the one pair of word line cut regions WLC may define a width of the plurality of gate electrodes 130 in the second direction (Y direction).

A plurality of common source lines 180 vertically overlapping the plurality of word line cut regions WLC may be disposed on the substrate 110 in the first direction (X direction). Insulating spacers 182 may be disposed on both sidewalls of the plurality of common source lines 180. FIG. 6 illustrates that the plurality of common source lines 180 has a bottom surface disposed at a level lower than the main surface 110M of the substrate 110, but in some example embodiments, the plurality of common source lines 180 may have a bottom surface disposed at a same level as the main surface 110M of the substrate 110.

A plurality of common source regions 112 may be disposed in the substrate 110 under the common source line 180 in the first direction (X direction). The plurality of common source regions 112 may be impurity regions doped with n-type impurities at a high concentration. The plurality of common source regions 112 may function as source regions for supplying current to the memory cells. The plurality of common source regions 112 may be disposed at positions overlapping the plurality of word line cut regions WLC.

As shown in FIG. 2, in the one block, the uppermost gate electrode 130 may be separated into two portions by the string isolation layer 184 in a plan view. Although not shown, the string isolation layer 184 may extend from the same level as the top surface of the second insulating layer 122 to a level lower than a bottom surface of the uppermost gate electrode 130.

The plurality of gate electrodes 130 may extend in the connection area CON to constitute the pad part PAD. As the plurality of gate electrodes 130 become away from the main surface 110M of the substrate 110, the plurality of gate electrodes 130 may extend in the first direction (X direction) with a shorter length. The pad part PAD may refer to portions of the plurality of gate electrodes 130 disposed in a step shape. The second insulating layer 122 may be disposed on the plurality of gate electrodes 130 constituting the pad part PAD, and a plurality of pad contacts 172 may be disposed in the connection area CON while penetrating the second insulating layer 122 and connecting to the plurality of gate electrodes 130.

As shown in FIG. 5, a plurality of dummy channel structures D140 may be disposed in the dummy channel holes D140H penetrating the plurality of gate electrodes 130 in the connection area CON, and the plurality of dummy channel structures D140 may extend from the main surface 110M of the substrate 110 in the third direction (Z direction). The dummy channel structure D140 may be formed to ensure structural stability of the semiconductor device 100 in the manufacturing process of the semiconductor device 100. Each of the plurality of dummy channel structures D140 may have the same structure as the channel structure C140. Each of the plurality of dummy channel structures D140 may have the same width as the channel structure C140, or may have a greater width than the channel structure C140.

Since the storing of data in a semiconductor device is generally performed by using a method of injecting charge into a charge storage structure through a Fowler-Nordheim tunneling (F-N tunneling), the charge storage structure being disposed between a gate electrode and a channel layer, the charge storage structure and the channel layer are sequentially formed in this order in a channel hole. However, as a vertical height of the semiconductor device increases, the difficulty of a process of forming a cell contact layer by selective epitaxial growth (SEG) at a bottom portion of a channel hole so that a channel layer and a substrate are electrically connected, or a process of etching a storage structure at the bottom portion of the channel hole, is significantly increased, which limits the increase of vertical height of the semiconductor device.

However, according to the example embodiments described above, the channel layer 142, the charge storage structure 144, and the body gate layer 146 may be sequentially formed in the channel hole C140H, and the storing of data may be performed by injecting charge into the charge storage structure 144 by voltages respectively and independently applied to the gate electrode 130 and the body gate layer 146. That is, a high difficulty manufacturing process such as the process of forming the cell contact layer by selective epitaxial growth (SEG) at the bottom portion of the channel hole or the process of etching the storage structure at the bottom portion of the channel hole may not be required. Accordingly, the semiconductor device 100 may implement the increase of height in the vertical direction or high integration. In addition, as described below, the application of the programming voltage through the body gate layer 146 may significantly reduce the disturbance between word lines, and thus the cell operation characteristics or the electrical characteristics of the semiconductor device 100 may be improved.

Hereinafter, an example driving method of the semiconductor device 100 will be described with reference to FIGS. 8 to 12.

Figure 8:
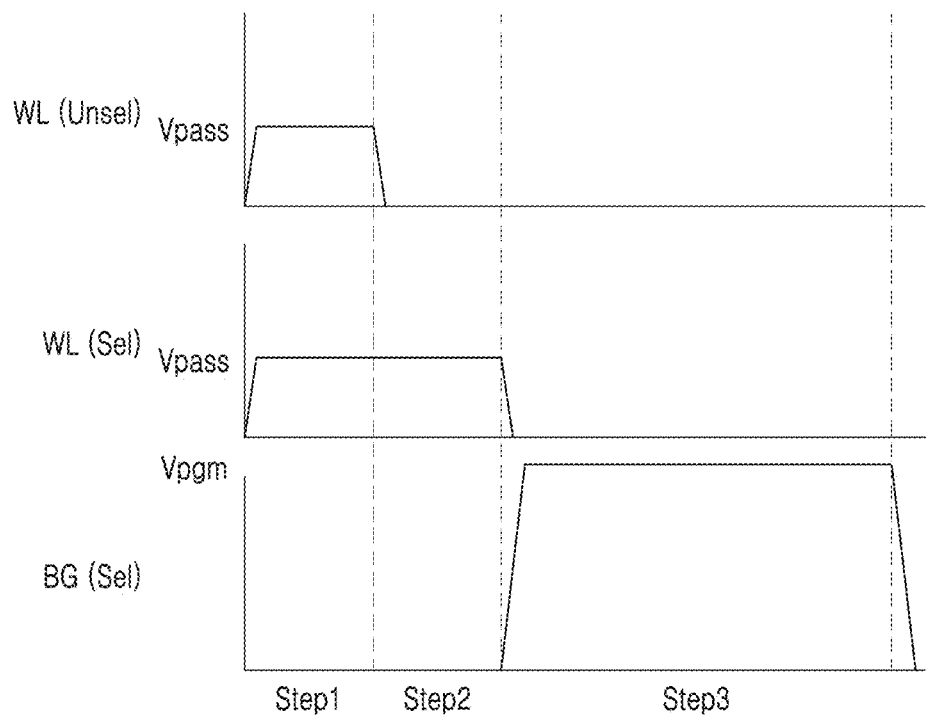
FIG. 8 illustrates a timing diagram of a programming voltage applied to a memory cell programmed in an example programming operation of a semiconductor device according to some example embodiments.
Figure 9:
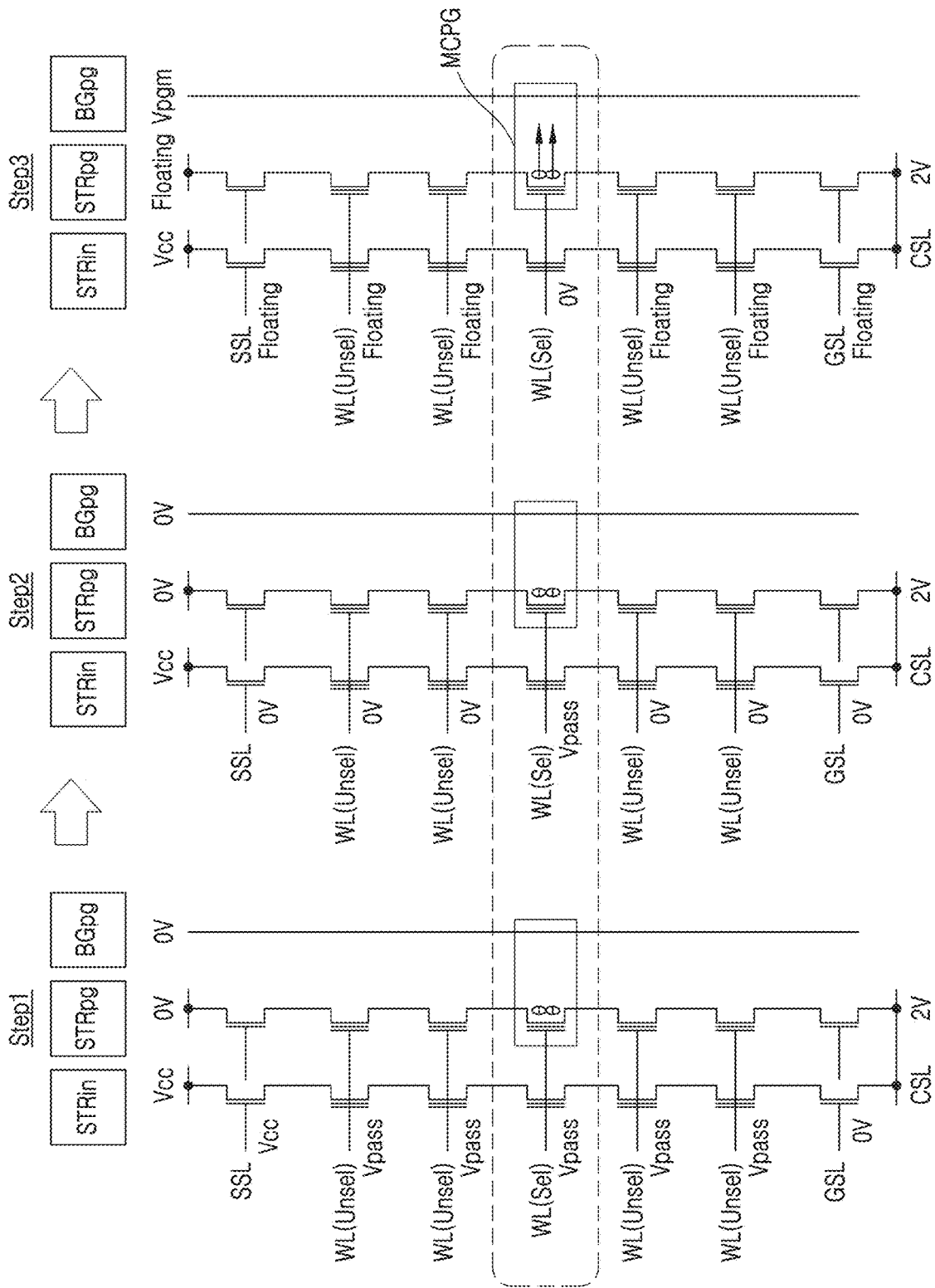
FIG. 9 is a circuit diagram illustrating voltages applied to a program string, an inhibit string, and a body gate line in a programming operation according to some example embodiments.
Figure 10:
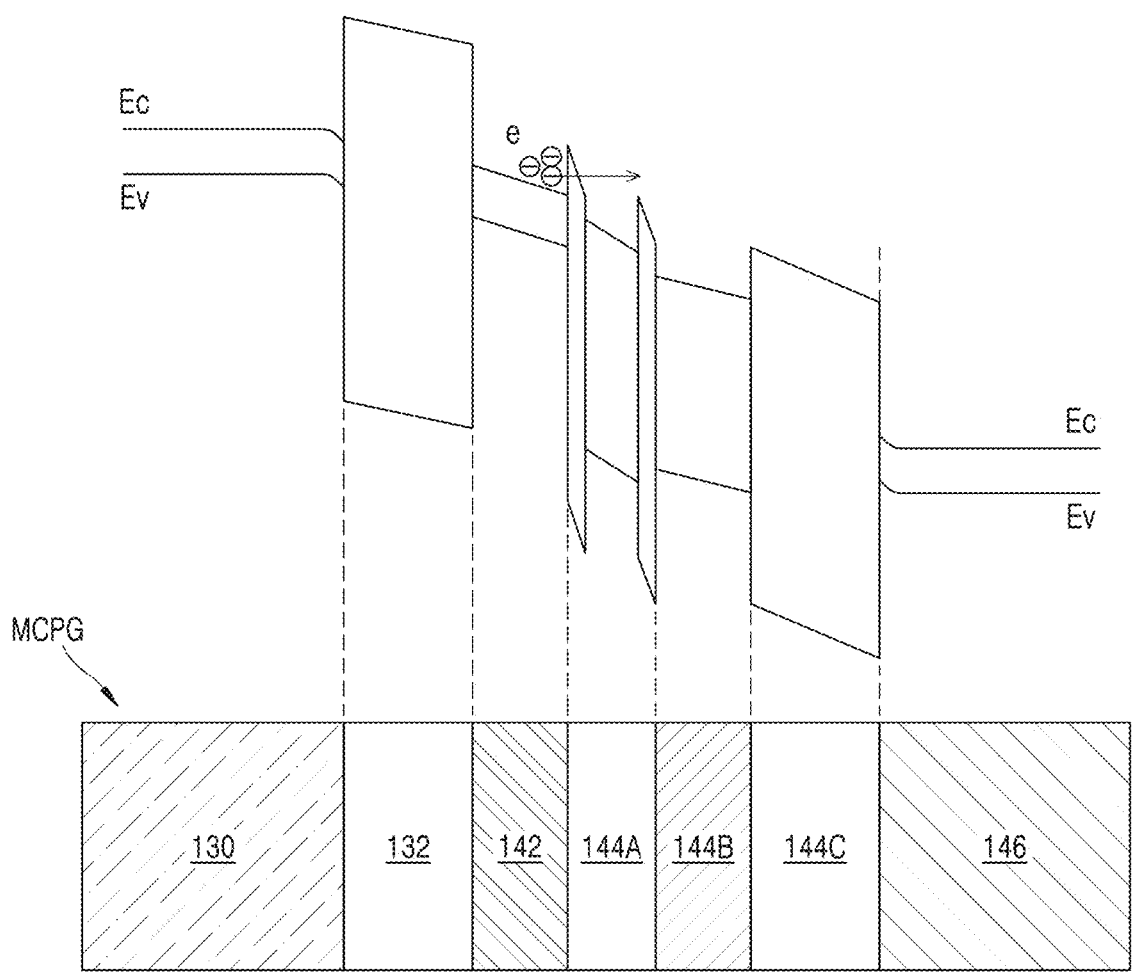
FIG. 10 illustrates a schematic energy band diagram of components included in a memory cell programmed in step 3 of FIG. 9.
Figure 11:
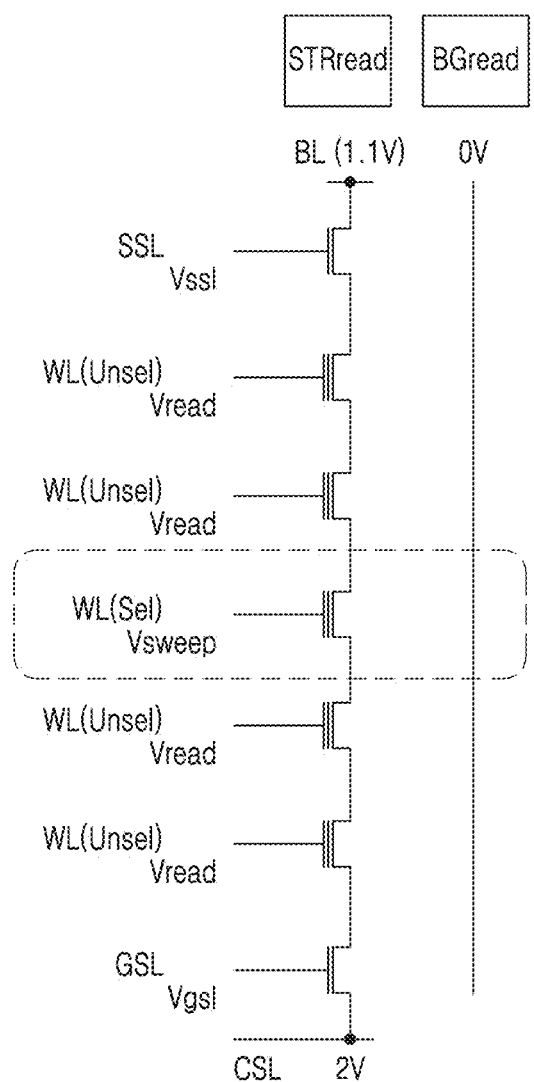
FIG. 11 is a circuit diagram illustrating voltages applied to a string and a body gate line on which reading is performed in an example reading operation of a semiconductor device according to some example embodiments.
Figure 12:
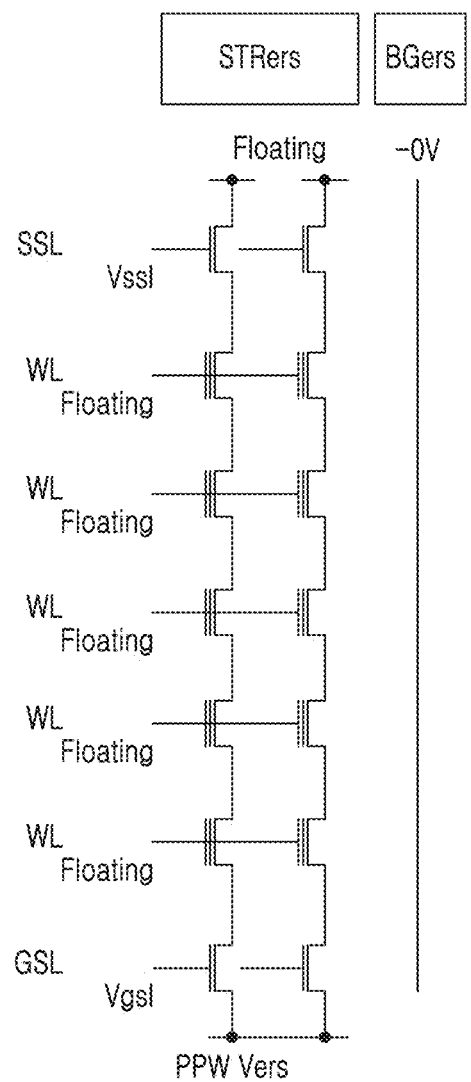
FIG. 12 is a circuit diagram illustrating voltages applied to a string and a body gate line on which erasing is performed in an example erasing operation of a semiconductor device according to some example embodiments.

FIG. 8 illustrates a timing diagram of a programming voltage applied to a memory cell programmed in an example programming operation of the semiconductor device 100. FIG. 9 is a circuit diagram illustrating voltages applied to a program string, an inhibit string, and a body gate line in a programming operation. FIG. 10 illustrates a schematic energy band diagram of components included in a memory cell programmed in Step 3 of FIG. 9. FIG. 11 is a circuit diagram illustrating voltages applied to a string and a body gate line on which reading is performed in an example reading operation of the semiconductor device 100. FIG. 12 is a circuit diagram illustrating voltages applied to a string and a body gate line on which erasing is performed in an example erasing operation of the semiconductor device 100.

In FIGS. 8 to 12, programming, reading, and erasing operations of one memory cell MCT1 (see FIG. 1) provided between one bit line BL1 (see FIG. 1), one body gate line BGL1 (see FIG. 1), and one word line WL1 (see FIG. 1) will be described by way of example.

Referring first to FIGS. 8 to 9, an example programming operation of the semiconductor device 100 may be performed by a sequence including Steps 1 to 3 in order.

In Step 1, a voltage of 0 V may be applied to a string STRpg (hereinafter, referred to as a "programming string") including a memory cell MCPG to be programmed, via a bit line connected thereto. A power supply voltage Vcc may be applied to the strings STRin (hereinafter, referred to as an "inhibit string") connected to the remaining bit lines except for the bit line connected to the programming string STRpg, via the bit line. A pass voltage Vpass may be applied to all word lines WL(Unsel) and WL(Sel) (that is, both the unselected word line WL(Unsel) and the selected word line WL(Sel)). A voltage of 0 V may be applied to the body gate line BGpg (hereinafter, referred to as a "programming body gate line") adjacent to the memory cell MCPG to be programmed. During Step 1, charging of electrons may be performed on a channel of the programming string STRpg.

In Step 2, while the pass voltage Vpass is applied to the selected word line WL(Sel), a voltage of 0 V may be applied to the unselected word line WL(Unsel) and a voltage of 0 V may be applied to the programming body gate line BGpg. During Step 2, electrons may be accumulated in the channel of the selected word line WL(Sel).

In Step 3, a programming voltage Vpgm may be applied to the programming body gate line BGpg, and a voltage of 0 V may be applied to the selected word line WL(Sel). Also, the bit line connected to the programming string STRpg and the unselected word line WL(Unsel) may be floated. In example embodiments, the programming voltage Vpgm may have a greater value than the pass voltage Vpass. In Step 3, as exemplarily shown in FIG. 10, electrons may be tunneled from the channel layer 142 of the memory cell MCPG constituted by the selected word line WL(Sel) (e.g., the selected gate electrode 130) toward the body gate layer 146, and electrons may be injected into the charge storage structure 144 (e.g., the charge storage layer 144B) between the channel layer 142 and the body gate layer 146. In some example embodiments, the programming voltage Vpgm may have a lower value than a programming voltage applied to a selected word line in the conventional semiconductor device, but is not limited thereto.

Referring to FIG. 11, an example reading operation of the semiconductor device 100 may be performed in a page unit. For example, a sweep voltage Vsweep may be applied to the selected word line WL(Sel) of the string STRread on which the reading operation is to be performed, and a read voltage Vread may be applied to the unselected word line WL(Unsel), and a voltage of 0 V may be applied to the body gate line BGread on which the reading operation is to be performed, and thus the reading operation may be performed. In this case, a string select voltage Vssl and a ground select voltage Vgsl may be applied to the string select line SSL and the ground select line GSL of the string STRread on which the reading operation is to be performed.

Referring to FIG. 12, an example erasing operation of the semiconductor device 100 may be performed in a block unit. For example, an erase voltage Vers may be applied to an well region PPW of a string STRers on which the erasing operation is to be performed, and a voltage of 0 V may be applied to a body gate line BGers on which the erasing operation is to be performed, and thus the erasing operation of a memory cell block may be performed by floating all the word lines WL.

According to the example embodiments described above, the semiconductor device 100 may apply the programming voltage Vpgm to the programming body gate line BGpg by a sequence including Steps 1 to 3 in order, particularly during Step 3, and thus may perform the programming operation of the memory cell MCPG. In a conventional semiconductor device, a programming operation is performed by applying a programming voltage to a selected word line and applying a pass voltage to an unselected word line. In such a case, voltages having relatively large voltage difference may be applied between adjacent word lines having a relatively small separation distance, and the failure of cell operation due to disturbance between adjacent word lines may occur. However, according to example embodiments, since a relatively low voltage (for example, a pass voltage) may be applied to the word line as compared to the programming voltage applied to the body gate line, the disturbance between the word lines may be significantly reduced, and thus the semiconductor device 100 may have improved cell operating characteristics or improved electrical characteristics.

Figure 13:
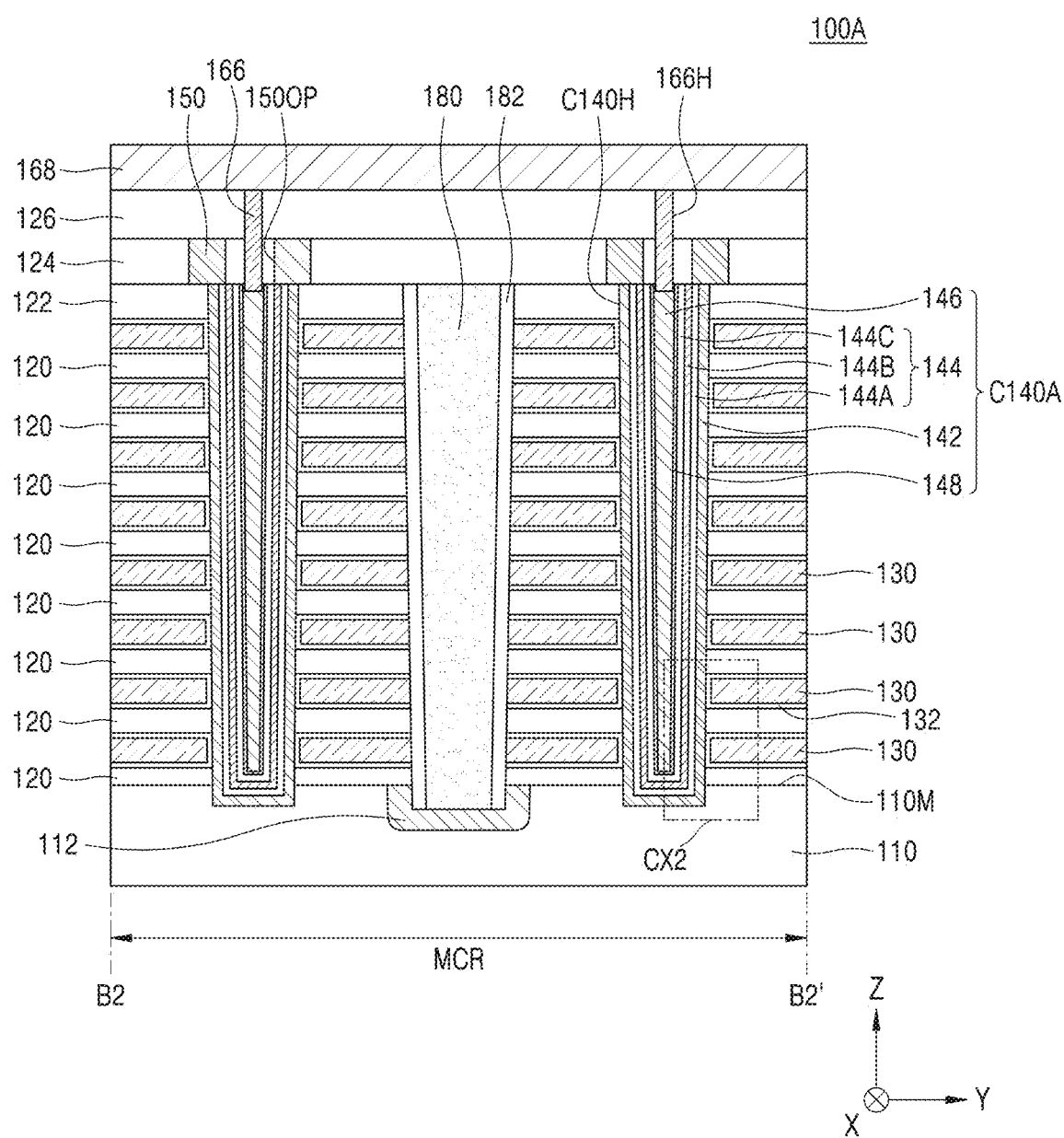
FIG. 13 is a cross-sectional view illustrating a semiconductor device according to some example embodiments.
Figure 14:
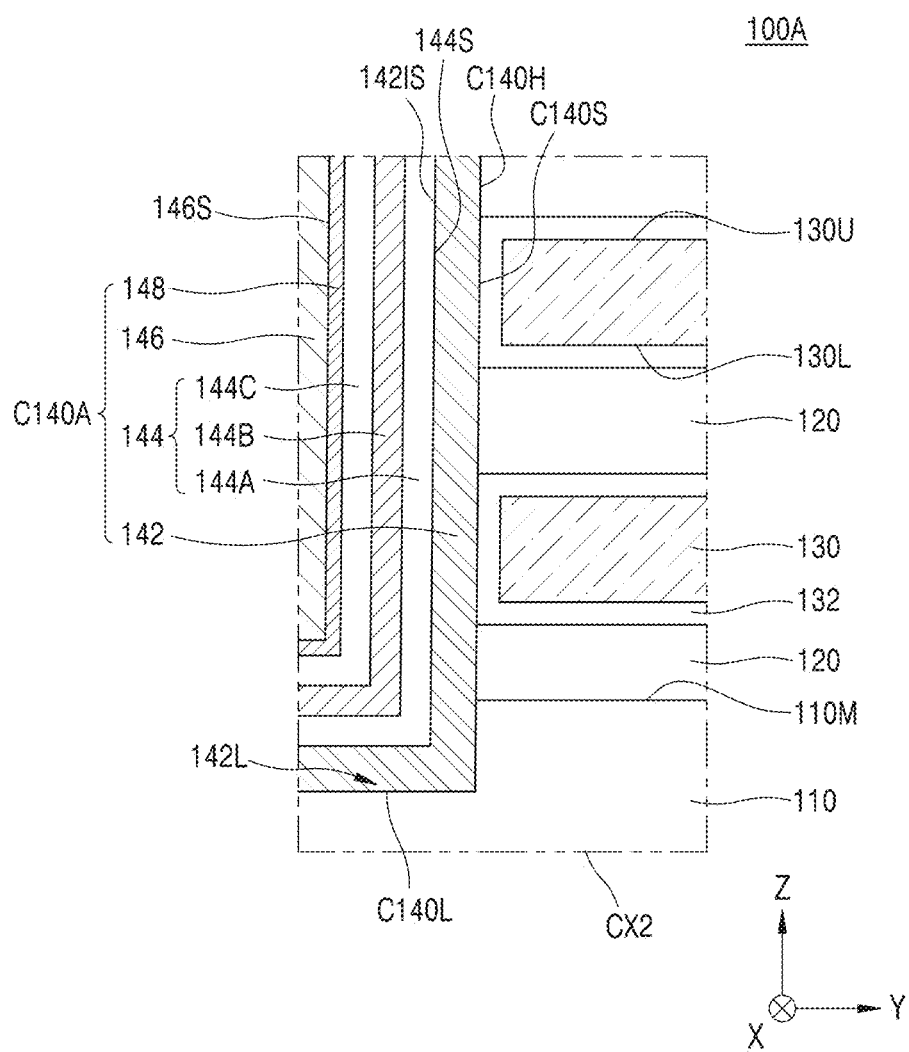
FIG. 14 is an enlarged cross-sectional view of a portion CX2 of FIG. 13.

FIG. 13 is a cross-sectional view illustrating a semiconductor device 100A according to example embodiments, and FIG. 14 is an enlarged cross-sectional view of a portion CX2 of FIG. 13. In FIGS. 13 and 14, like reference numerals as in FIGS. 1 to 12 mean similar components.

Referring to FIGS. 13 and 14, a channel structure C140A may further include a conductive barrier layer 148 between the charge storage structure 144 and the body gate layer 146. Accordingly, the sidewall 146S of the body gate layer 146 may be surrounded by the conductive barrier layer 148.

In example embodiments, the body gate layer 146 may include at least one of cobalt (Co), tungsten (W), nickel (Ni), ruthenium (Ru), copper (Cu), aluminum (Al), silicides thereof, and/or the alloys thereof. The conductive barrier layer 148 may include titanium nitride (TiN), tantalum nitride (TaN), tungsten nitride (WN), ruthenium (Ru), titanium (Ti), tantalum (Ta), and/or combinations thereof. Optionally, a high-k insulating layer (not shown) may be further formed between the conductive barrier layer 148 and the charge storage structure 144.

Figure 15:
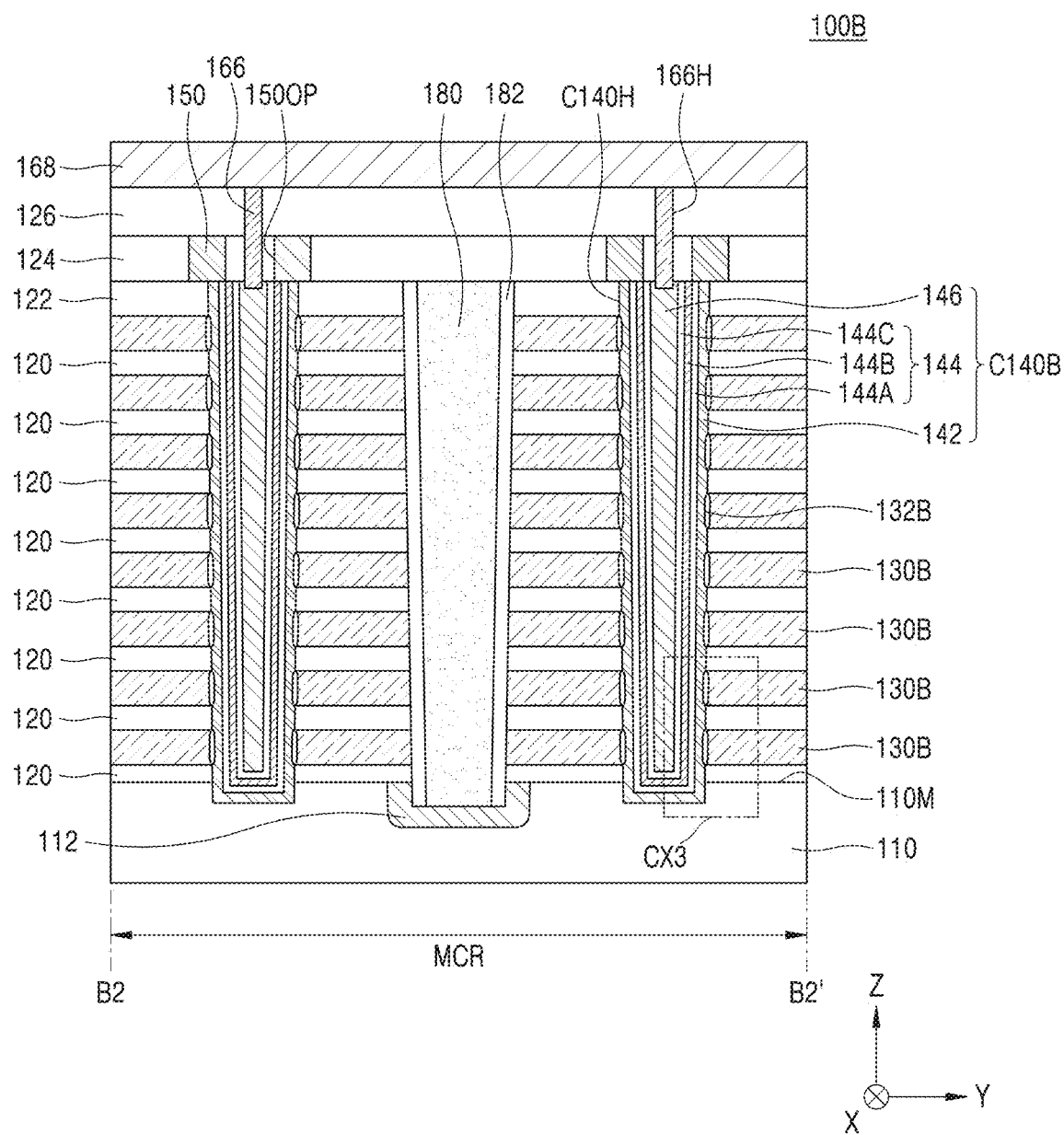
FIG. 15 is a cross-sectional view illustrating a semiconductor device according to some example embodiments.
Figure 16:
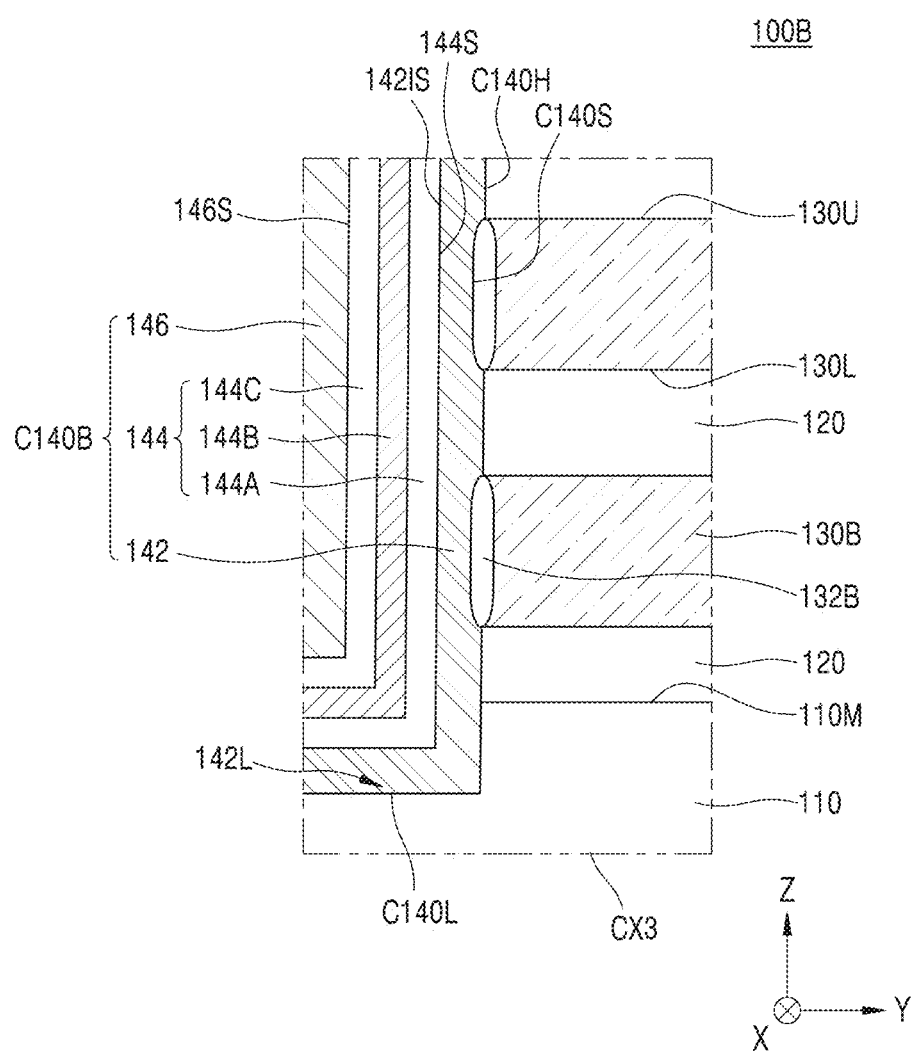
FIG. 16 is an enlarged cross-sectional view of a portion CX3 of FIG. 15.

FIG. 15 is a cross-sectional view illustrating a semiconductor device 100B according to example embodiments, and FIG. 16 is an enlarged cross-sectional view of a portion CX3 of FIG. 15. In FIGS. 15 and 16, like reference numerals as in FIGS. 1 to 14 mean similar components.

Referring to FIGS. 15 and 16, a gate insulating layer 132B may be between a sidewall 140S of a channel structure C140B and a gate electrode 130B, and the gate insulating layer 132B may not be between the gate electrode 130B and the first insulating layer 120. A top surface 130U and a bottom surface 130L of the gate electrode 130 may contact the first insulating layer 120, and the first insulating layer 120 may contact a sidewall C140S (for example, an outer wall of the channel layer 142) of the channel structure C140B.

In example embodiments, the gate insulating layer 132B may include a thermal oxide layer formed by a thermal oxidation process. For example, after removing a sacrificial layer 310 (see FIG. 31) to form a gate space 130GS, the gate insulating layer 132B may be formed on sidewalls of the channel layer 142 exposed to the gate space 130GS by performing the thermal oxidation process, but is not limited thereto.

Figure 17:
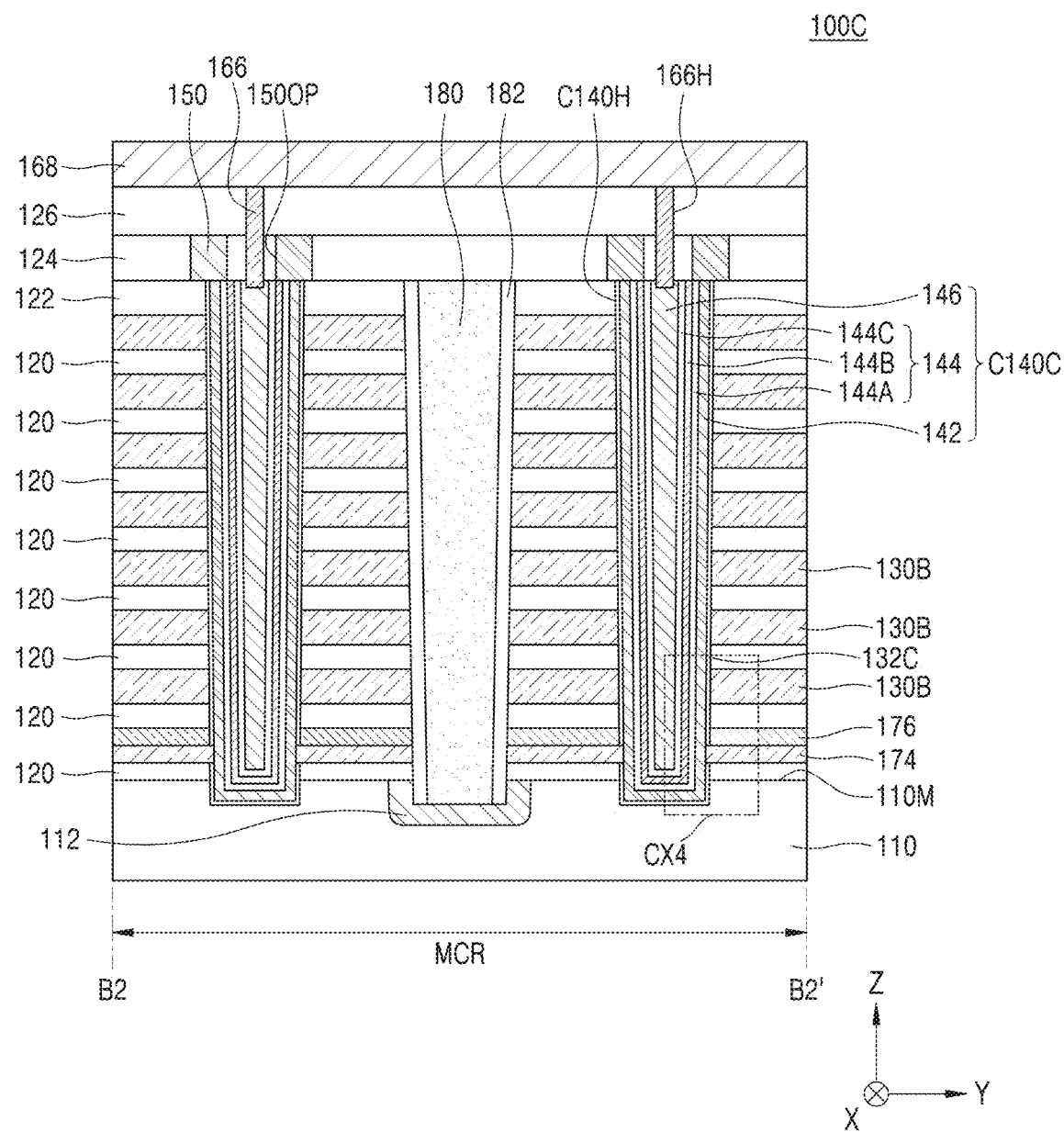
FIG. 17 is a cross-sectional view illustrating a semiconductor device according to some example embodiments.
Figure 18:
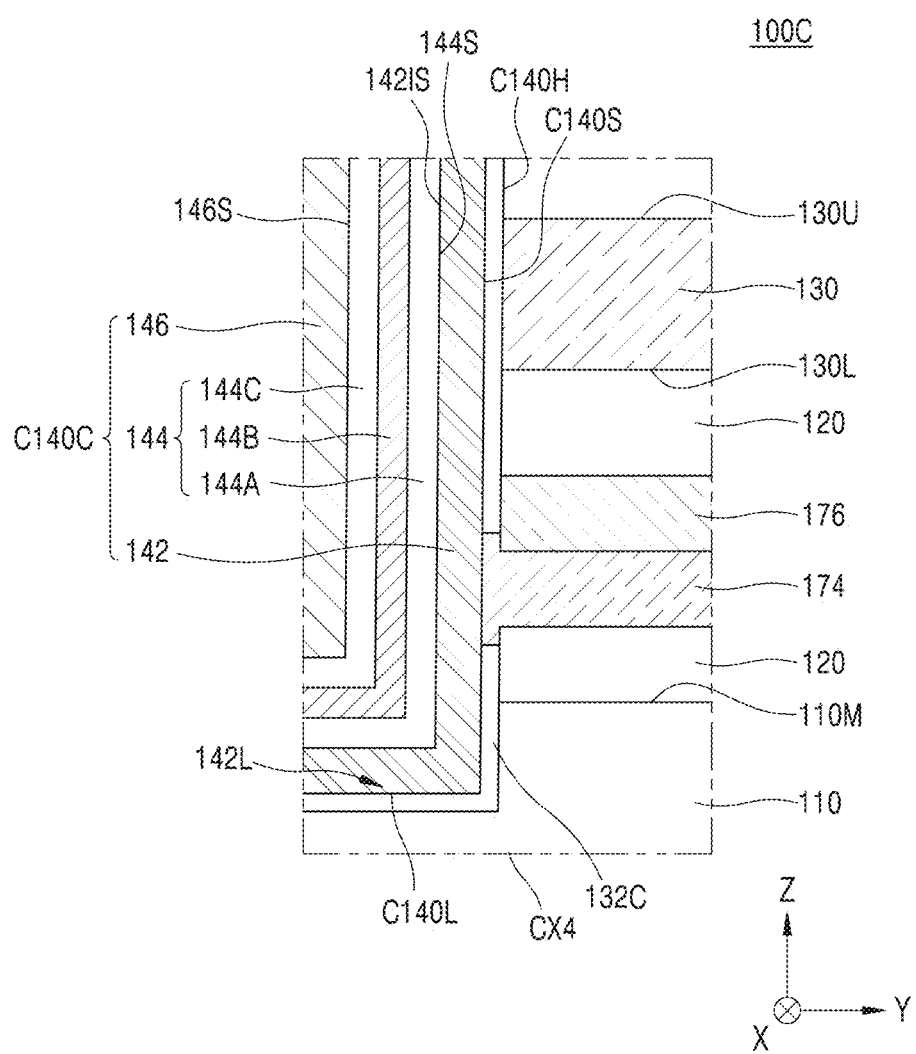
FIG. 18 is an enlarged cross-sectional view of a portion CX4 of FIG. 17.

FIG. 17 is a cross-sectional view illustrating a semiconductor device 100C according to example embodiments, and FIG. 18 is an enlarged cross-sectional view of a portion CX4 of FIG. 17. In FIGS. 17 and 18, like reference numerals as in FIGS. 1 to 16 mean similar components.

Referring to FIGS. 17 and 18, a bottom portion of a channel structure C140C may be surrounded by a first semiconductor layer 174 and a second semiconductor layer 176. The first semiconductor layer 174 may include doped polysilicon or undoped polysilicon, and also the second semiconductor layer 176 may include doped polysilicon or undoped polysilicon. The first semiconductor layer 174 may serve as a common source line extension region and may be a portion corresponding to the common source line CSL of FIG. 1. The second semiconductor layer 176 may serve as a support layer to prevent a mold stack from collapsing or falling down in the process of removing a sacrificial layer for forming the first semiconductor layer 174.

The channel structure C140C may penetrate the first semiconductor layer 174 and the second semiconductor layer 176 and may extend to a level lower than a main surface 110M of a substrate 110. A gate insulating layer 132C may be disposed on an inner wall of the channel hole C140H, and may be disposed to surround the entire sidewall C140S and the entire bottom surface C140L of the channel structure C140C, except for a portion of the sidewall C140S of the channel structure C140C surrounded by the first semiconductor layer 174. Accordingly, the gate insulating layer 132C may be between the channel layer 142 and the gate electrode 130, and between the channel layer 142 and the first insulating layer 120, and also a top surface 130U and a bottom surface 130L of the gate electrode 130 may contact the first insulating layer 120.

Figure 19:
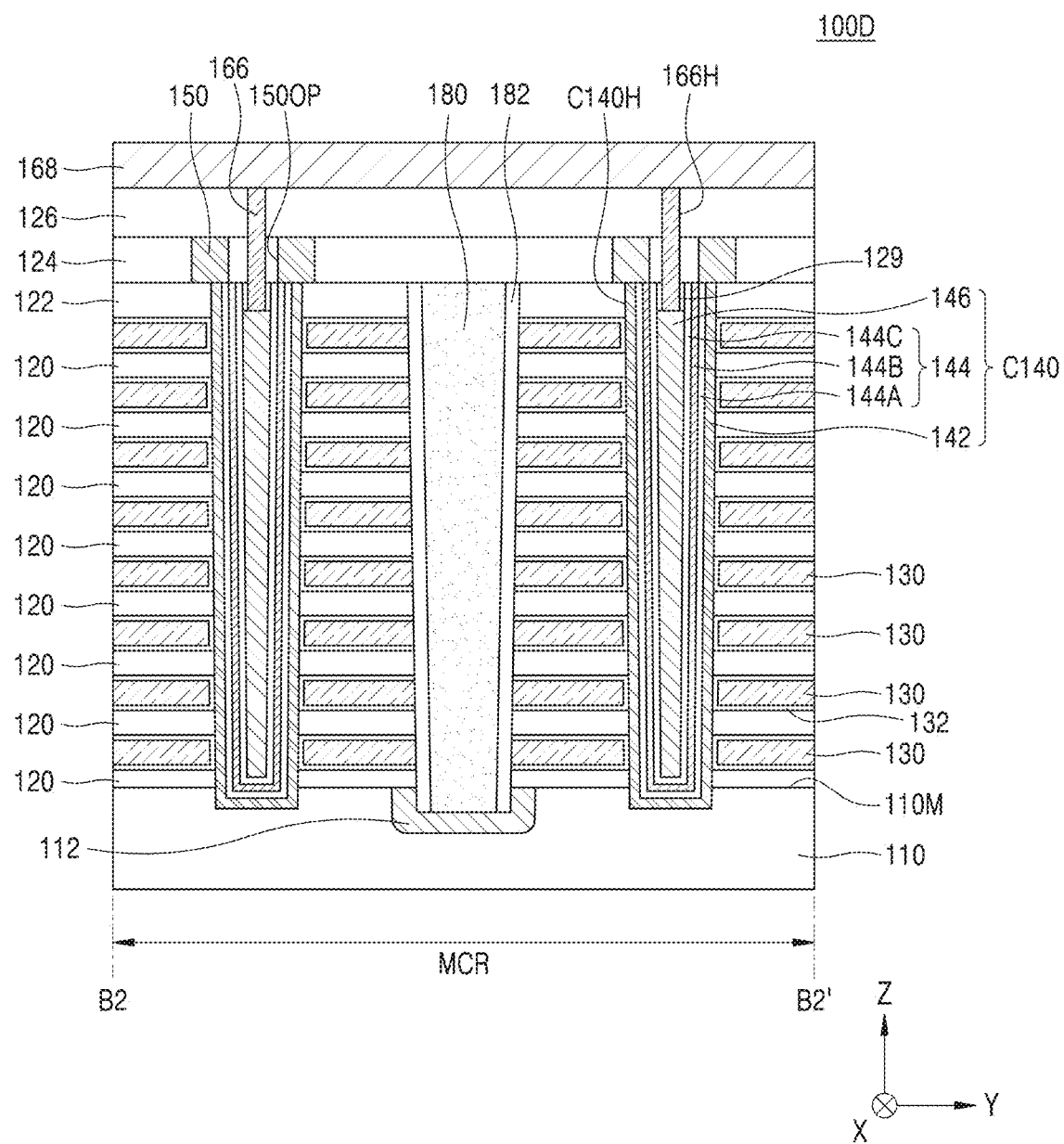
FIG. 19 is a cross-sectional view illustrating a semiconductor device according to some example embodiments.

FIG. 19 is a cross-sectional view illustrating a semiconductor device 100D according to some example embodiments. In FIG. 19, the same reference numerals as in FIGS. 1 to 18 denote the same components.

Referring to FIG. 19, a body gate layer 146 may have an upper surface disposed at a lower level than an upper surface of a second insulating layer 122, and a sixth insulating layer 129 may be disposed on the body gate layer 146, the sixth insulating layer 129 filling an upper inlet of a channel hole C140H, and a body gate contact 166 may penetrate the fourth insulating layer 126, the third insulating layer 124, and the sixth insulating layer 129 to connect to the body gate layer146. For example, since the upper surface of the body gate layer 146 may be disposed at a lower level than the upper surface of the second insulating layer 122, even when misalignment occurs in a patterning process for the bit line pad 150, undesirable electrical connection or short between the bit line pad 150 and the body gate layer 146 may be reduced or prevented.

Figure 20:
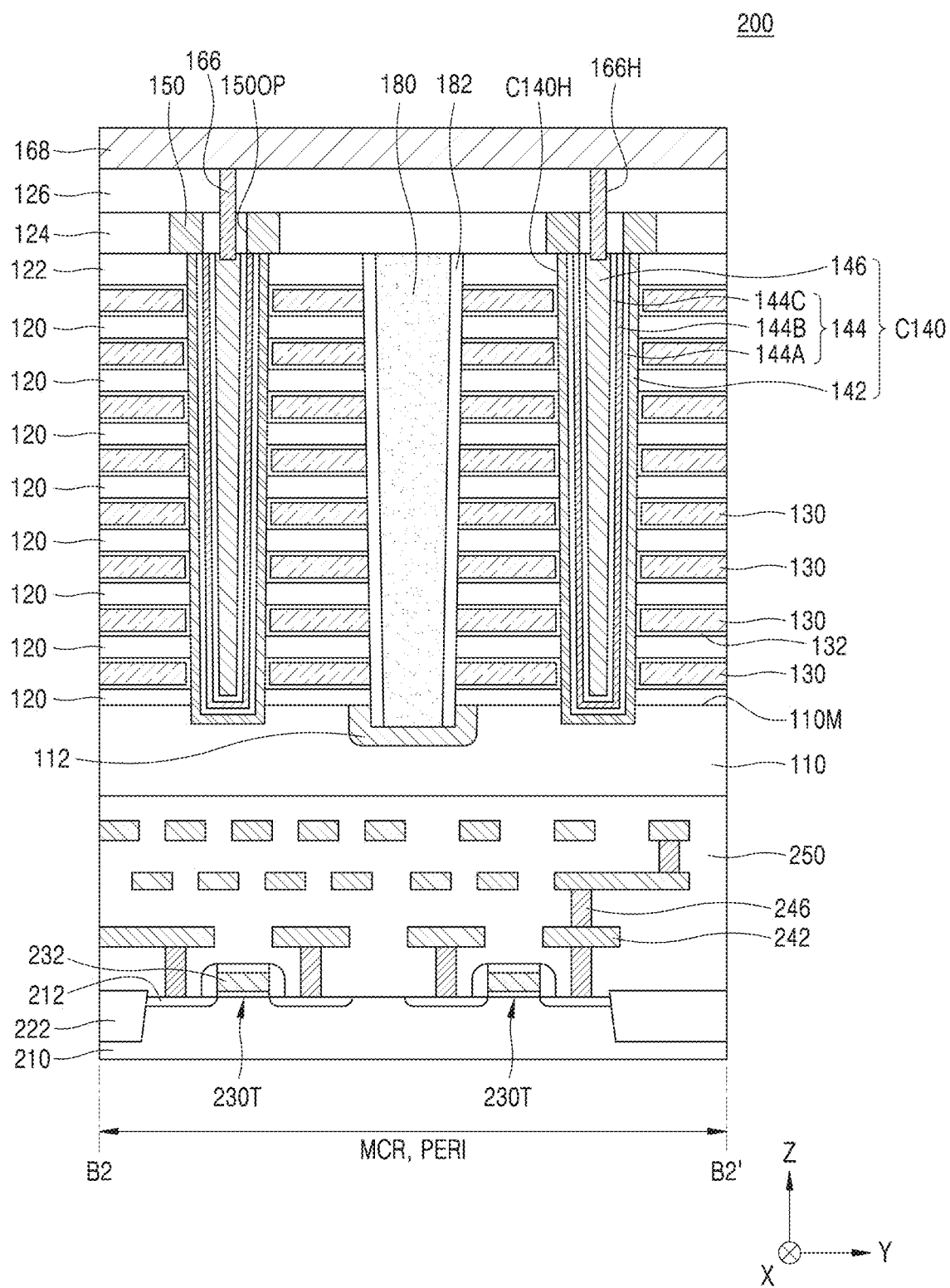
FIG. 20 is a cross-sectional view illustrating a semiconductor device according to some example embodiments.

FIG. 20 is a cross-sectional view illustrating a semiconductor device 200 according to some example embodiments.

In FIG. 20, the same reference numerals as in FIGS. 1 to 19 denote the same components.

Referring to FIG. 20, a lower substrate 210 may be disposed at a lower vertical level than the substrate 110. An active region (not shown) may be defined in the lower substrate 210 by a device isolation layer 222, and a plurality of driving transistors 230T may be formed on the active region. The plurality of driving transistors 230T may include a driving circuit gate structure 232 and impurity regions 212 disposed on portions of the lower substrate 210 below both sides of the driving circuit gate structure 232.

A plurality of interconnection layers 242, a plurality of contact plugs 246 connecting the plurality of interconnection layers 242 to each other or connecting the plurality of interconnection layers 242 to the driving transistor 230T, and a lower interlayer insulating layer 250 covering the plurality of interconnection layers 242 and the plurality of contact plugs 246 may be disposed on the lower substrate 210.

The substrate 110 may be disposed on the lower interlayer insulating layer 250. The plurality of first insulating layers 120 and the plurality of gate electrodes 130, the channel structure C140, the bit line 164 (see FIG. 5), and the body gate line 168 may be disposed on the substrate 110.

FIGS. 21 to 30 are schematic diagrams illustrating a method of manufacturing a semiconductor device 100 according to some example embodiments, in a process sequence. Specifically, FIGS. 21 to 30 are cross-sections corresponding to a cross-section taken along a line B2-B2' of FIG. 2. FIGS. 21 to 30, the same reference numerals as used in FIGS. 1 to 20 denote the same components.

Figure 21:
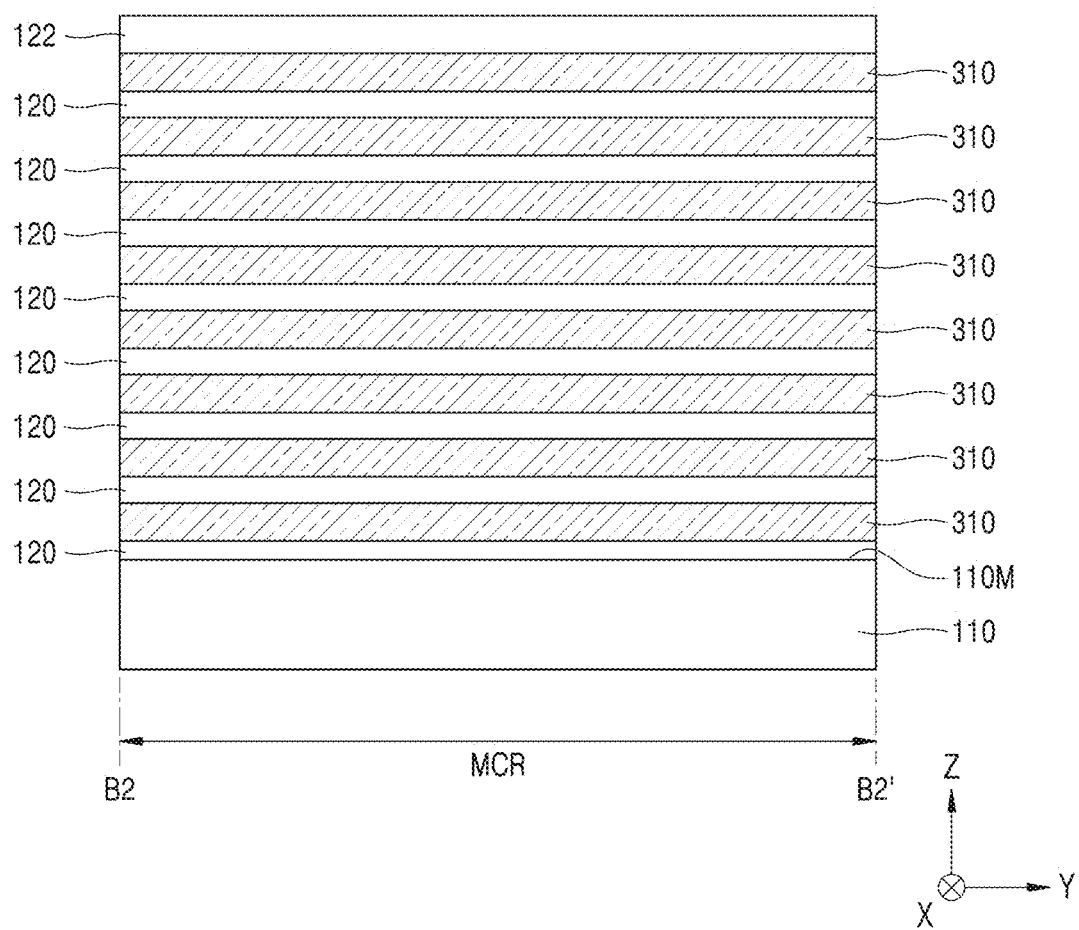
FIGS. 21 to 30 are schematic diagrams illustrating a method of manufacturing a semiconductor device according to some example embodiments, in a process sequence.

Referring to FIG. 21, the plurality of first insulating layers 120 and a plurality of sacrificial layers 310 may be alternately formed on the main surface 110M of the substrate 110. In example embodiments, the plurality of first insulating layers 120 may include an insulating material, such as silicon oxide or silicon oxynitride, and the plurality of sacrificial layers 310 may include silicon nitride, silicon oxynitride, or doped polysilicon with impurities, and/or the like.

Subsequently, although not shown, the pad part PAD (see FIG. 2) may be formed in the connection area CON (see FIG. 2) by sequentially patterning the plurality of first insulating layers 120 and the plurality of sacrificial layers 310. In some example embodiments, the pad part PAD may be formed in a step shape having a difference in a top surface level in the first direction (X direction).

Thereafter, the second insulating layer 122 may be formed to cover an uppermost sacrificial layer 310 and the pad part PAD. The second insulating layer 122 may include an insulating material such as silicon oxide and silicon oxynitride.

Figure 22:
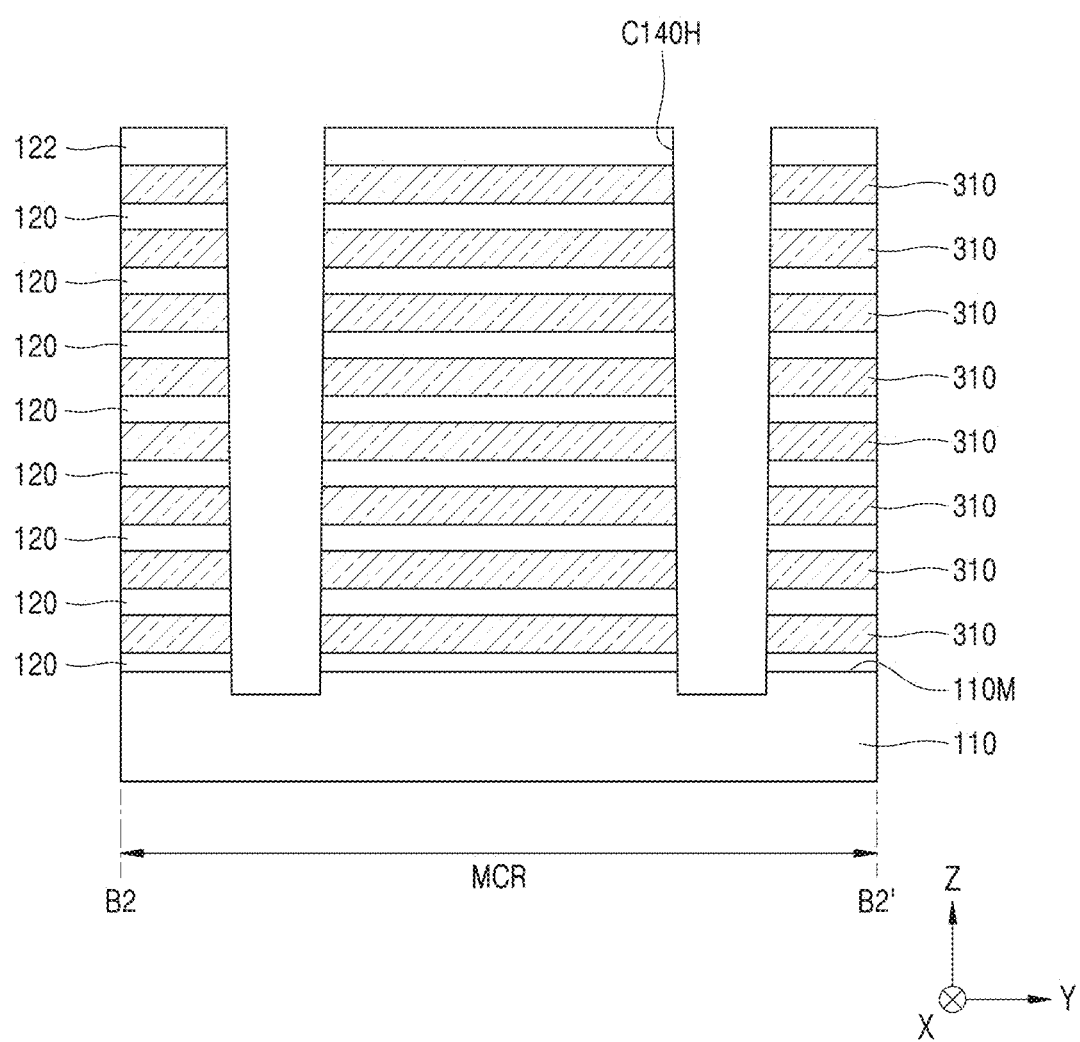

Referring to FIG. 22, a mask pattern (not shown) may be formed on the second insulating layer 122, and then portions of the second insulating layer 122, the plurality of first insulating layers 120 and the plurality of sacrificial layers 310 may be etched to form channel holes C140H by using the mask pattern as an etching mask. The channel hole C140H may extend to a level lower than the main surface 110M of the substrate 110.

Figure 23:
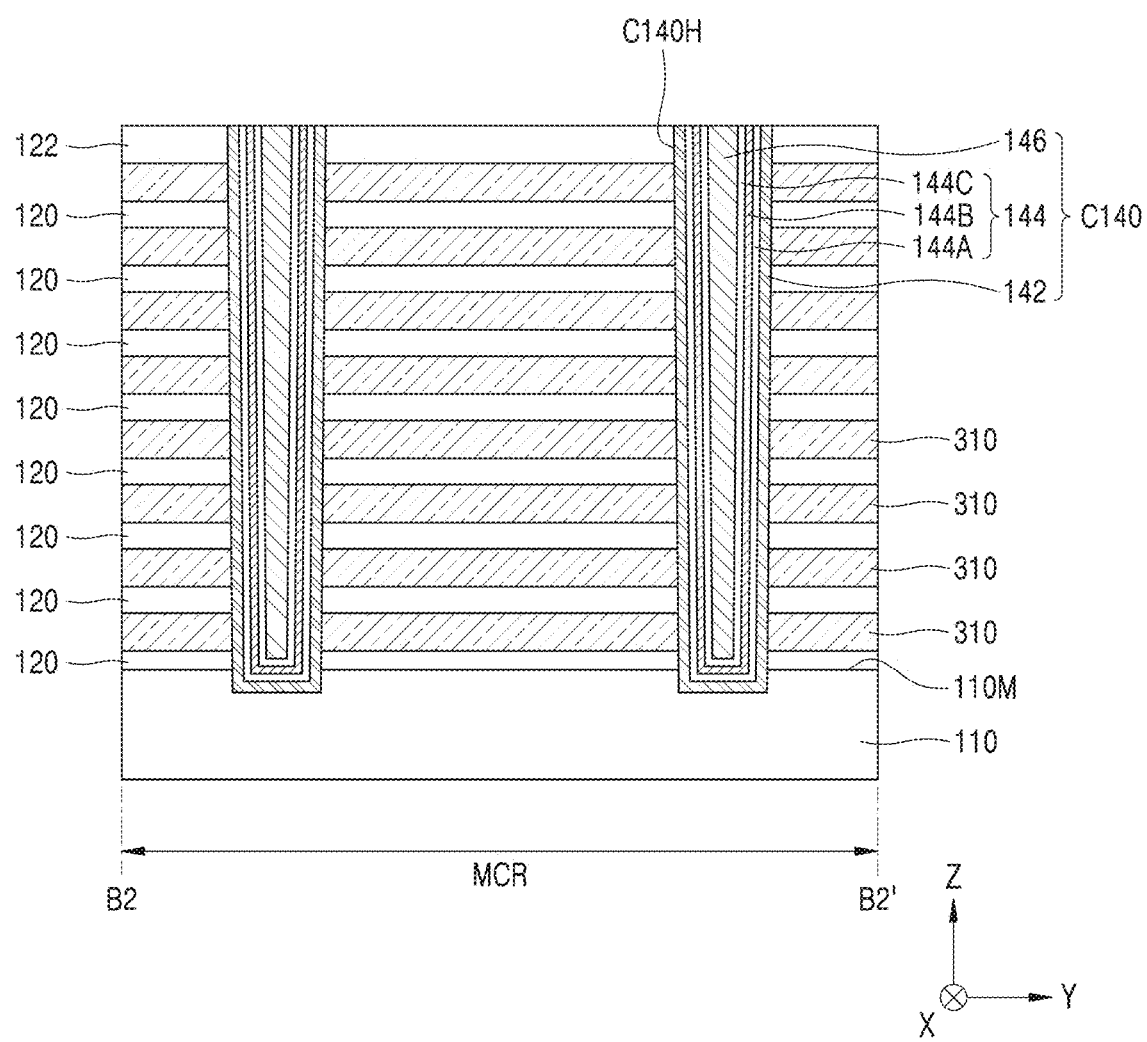

Referring to FIG. 23, the channel layer 142, the tunneling dielectric layer 144A, the charge storage layer 144B, the blocking dielectric layer 144C, and the body gate layer 146 may be sequentially formed on the inner wall of the channel hole C140H. Thereafter, a planarization process may be further performed to remove portions of the channel layer 142, the tunneling dielectric layer 144A, the charge storage layer 144B, the blocking dielectric layer 144C, and the body gate layer 146 formed on the second insulating layer 122. Herein, the tunneling dielectric layer 144A, the charge storage layer 144B, and the blocking dielectric layer 144C may be referred to as the charge storage structure 144. As a result of the planarization process, the body gate layer 146 may have a top surface disposed substantially coplanar with the top surfaces of the charge storage structure 144, the channel layer 142, and the second insulating layer 122.

In example embodiments, a bottom surface of the channel layer 142 may contact a top surface of the substrate 110 exposed to a bottom portion of the channel hole C140H. Therefore, a high difficulty manufacturing process such as a SEG process, which has been conventionally required, may not be required, and thus the difficulty of the manufacturing process for forming the channel structure C140 may be relatively low.

Figure 24:
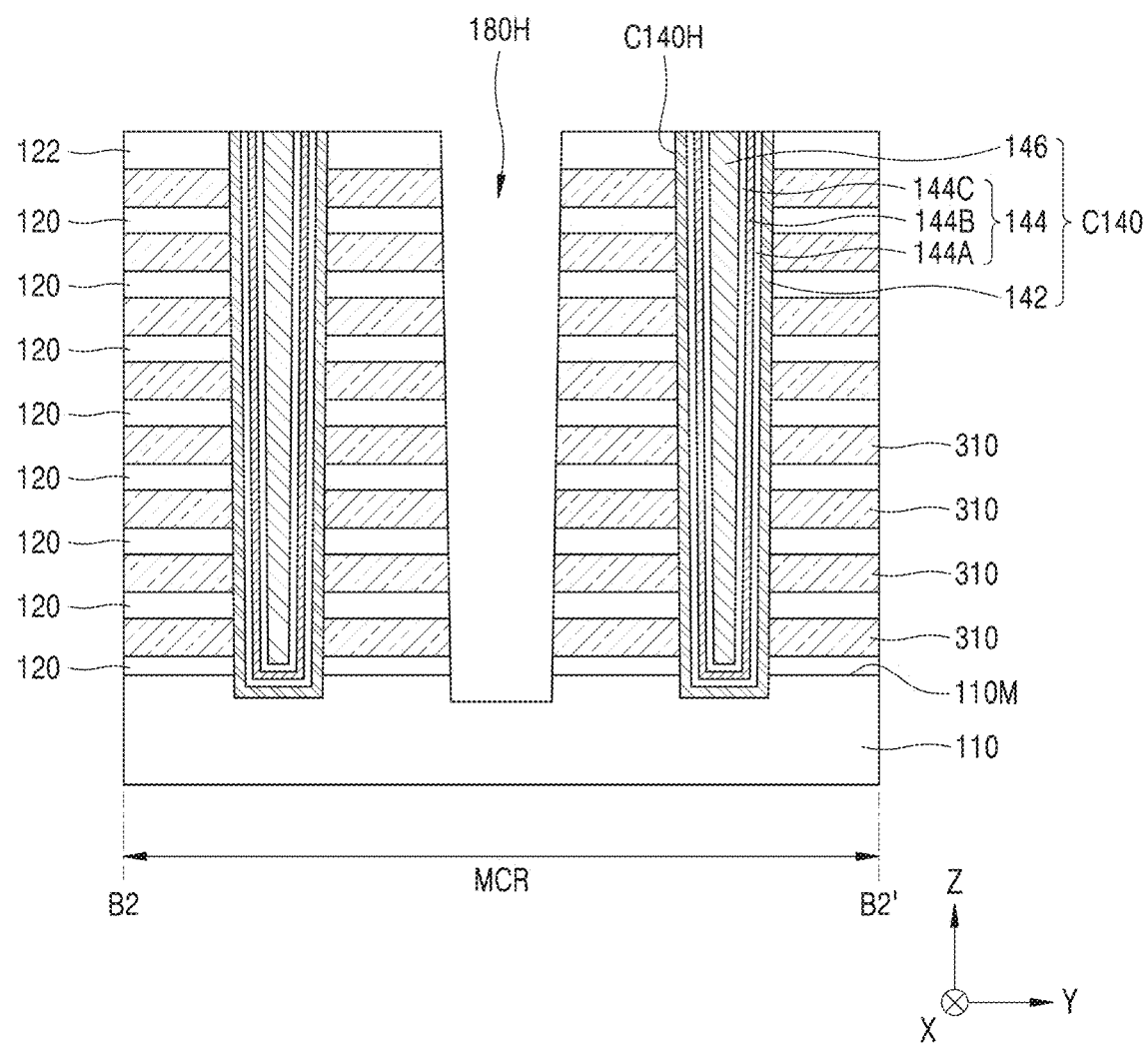

Referring to FIG. 24, a mask pattern (not shown) may be formed on the second insulating layer 122 and the channel structure C140, and a word line cut opening 180H may be formed by removing the sacrificial layers 310 and the first insulating layers 120 by using the mask pattern as an etching mask. The upper surface of the substrate 110 may be exposed at a bottom portion of the word line cut opening 180H.

Figure 25:
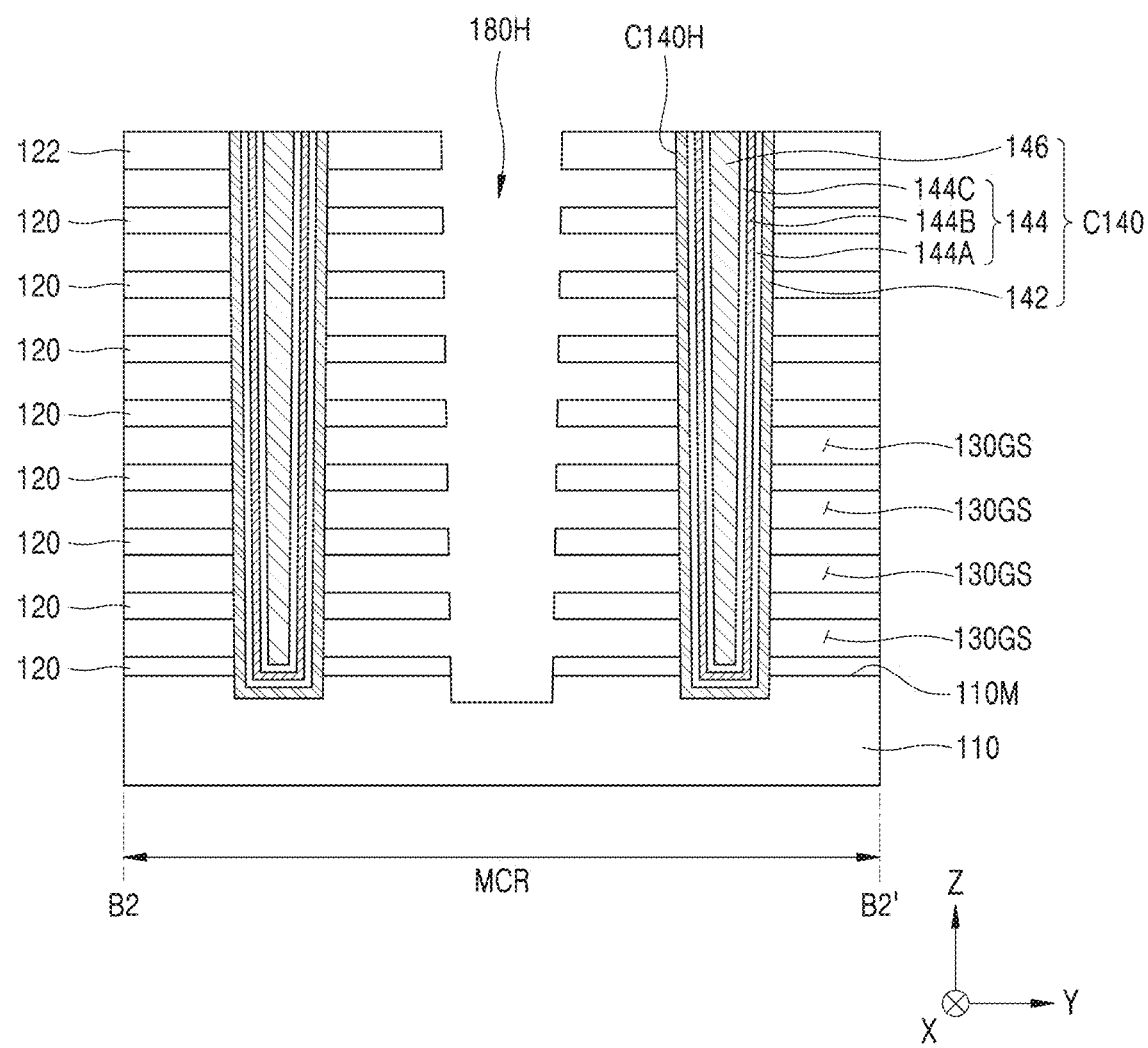

Referring to FIG. 25, the plurality of sacrificial layers 310 (see FIG. 24) exposed by the word line cut opening 180H may be removed to form a plurality of gate spaces 130GS. Sidewalls of the channel layer 142 may be exposed in the gate spaces 130GS. In example embodiments, the removing of the plurality of sacrificial layers 310 may be performed by a wet etching process using a phosphoric acid solution as an etchant.

Figure 26:
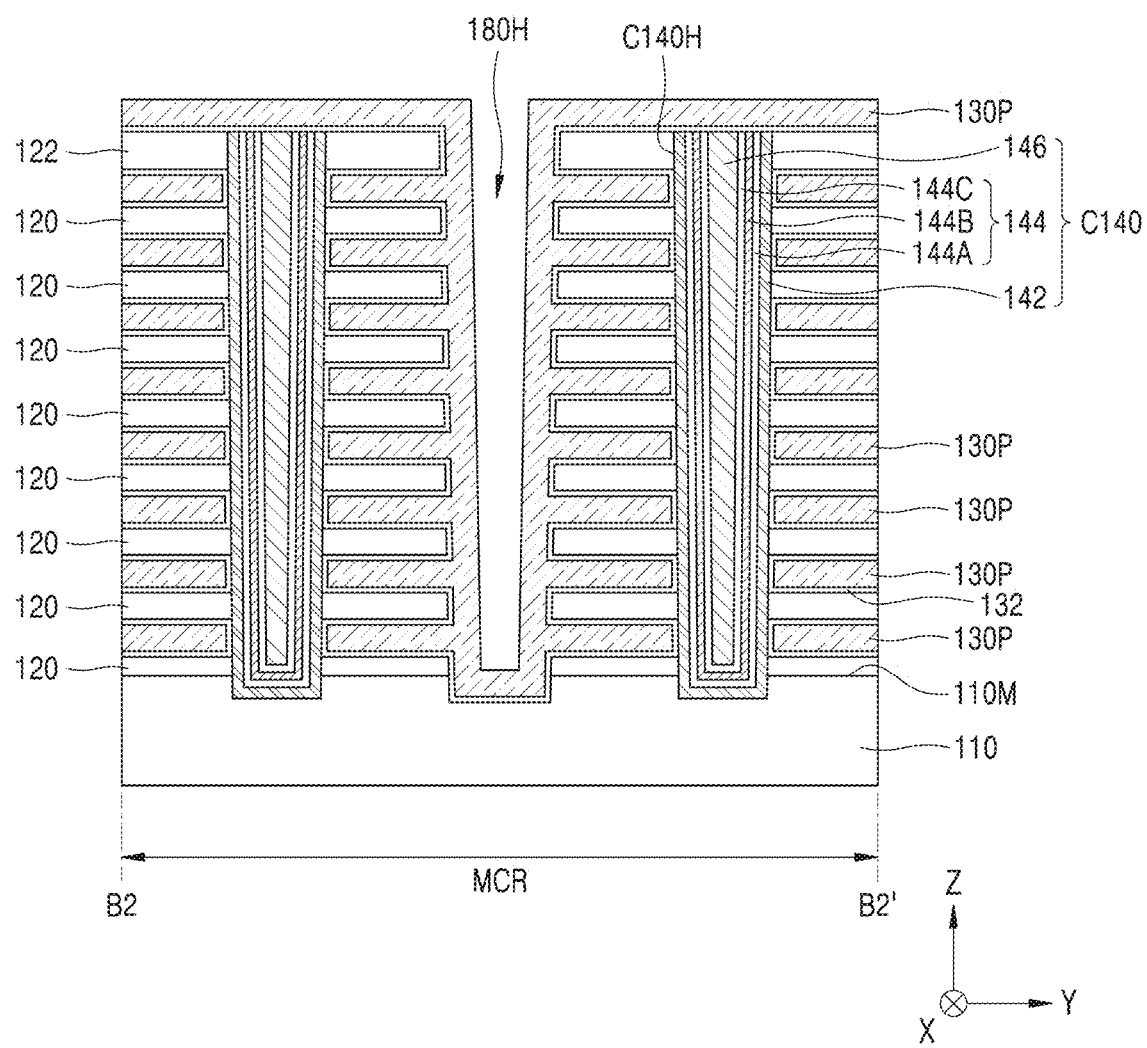

Referring to FIG. 26, the gate insulating layer 132 and a preliminary gate electrode layer 130P may be formed on inner walls of the word line cut opening 180H and the plurality of gate spaces 130GS. In order to form the preliminary gate electrode layer 130P, the conductive barrier layer 130UB (see FIG. 7) and the metal layer 130M (see FIG. 7) may be sequentially formed.

Figure 27:
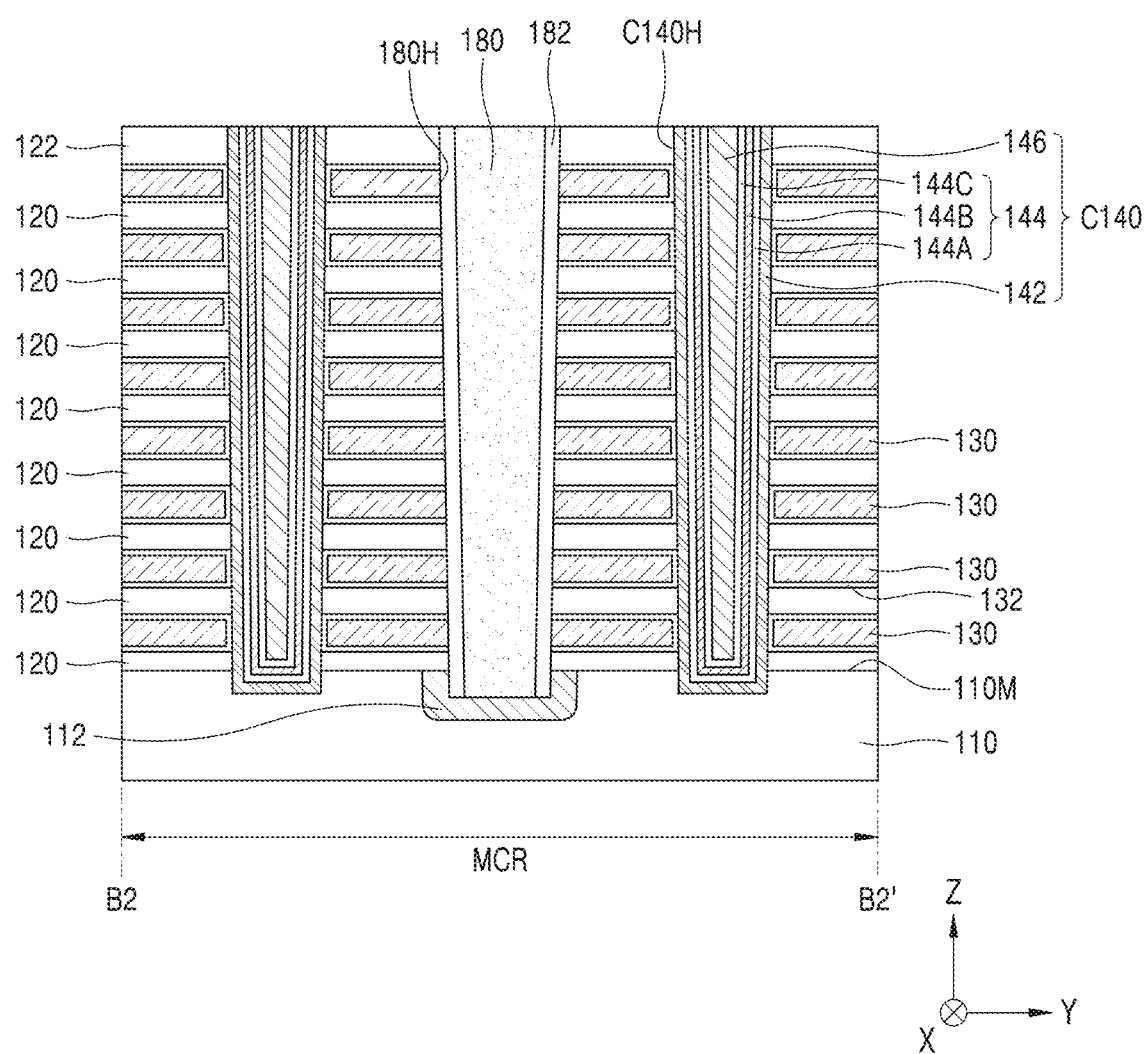

Referring to FIG. 27, portions of the gate insulating layer 132 and the preliminary gate electrode layer 130P disposed on the second insulating layer 122 and on the inner wall of the word line cut opening 180H may be removed, and thus the gate insulating layer 132 and the gate electrode 130 may be formed in the gate spaces 130GS.

Subsequently, impurities may be injected into the substrate 110 again exposed to the bottom portion of the word line cut opening 180H, and thus the common source region 112 may be formed in a portion of the substrate 110 disposed on the bottom portion of the word line cut opening 180H. Thereafter, an insulating spacer 182 may be formed on a sidewall of the word line cut opening 180H, and a common source line 180 may be formed on the insulating spacer 182 while filling an inside of the word line cut opening 180H.

Figure 28:
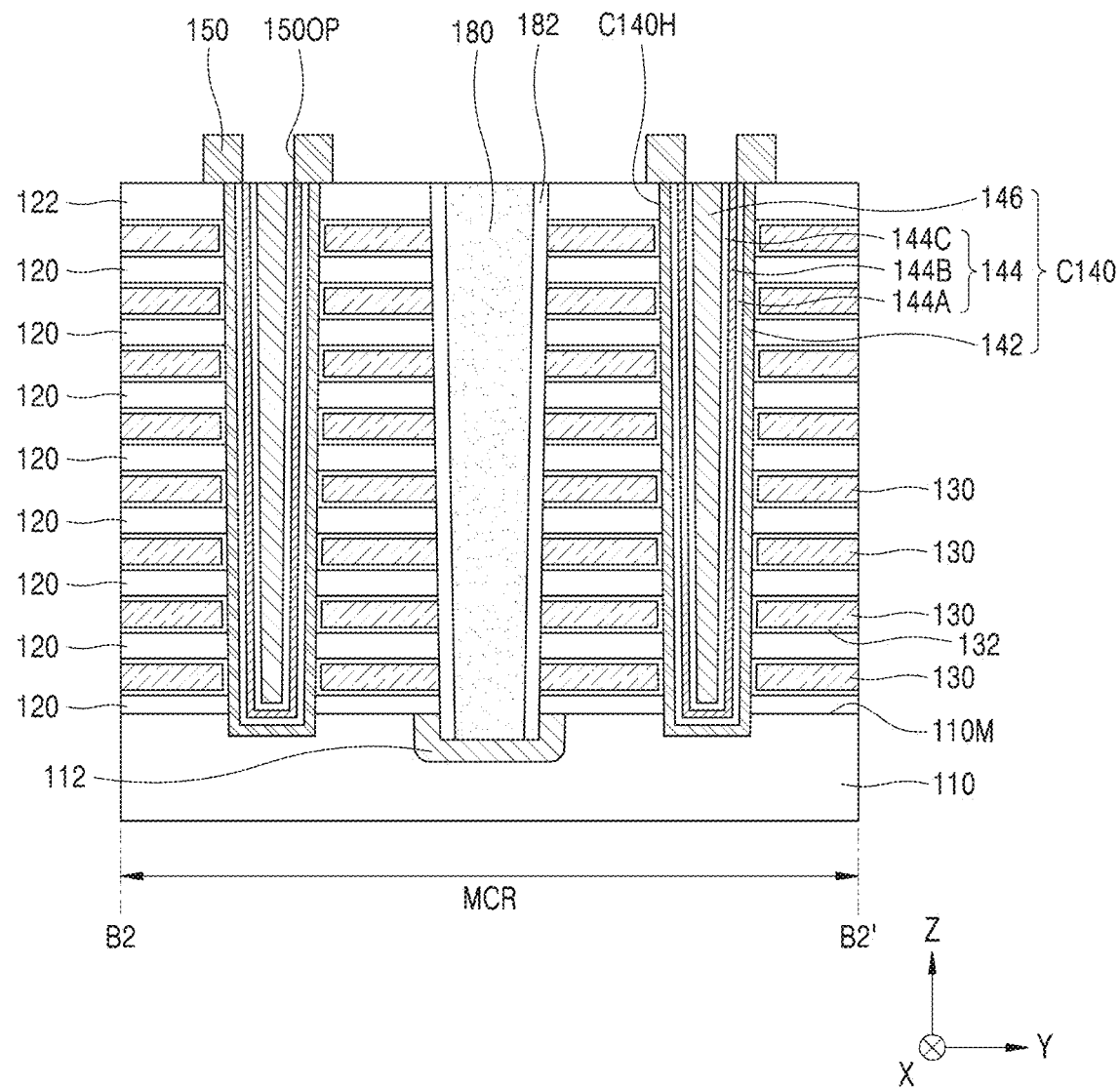

Referring to FIG. 28, a conductive layer (not shown) may be formed on the channel structure C140 and the second insulating layer 122, and then the bit line pad 150 may be formed by patterning the conductive layer. The bit line pad 150 may be formed to have an annular shape as shown in FIG. 4A, and the inner wall of the bit line pad 150 may surround the body gate layer 146 while being spaced apart from the body gate layer 146 at a desired (or, alternatively predetermined) interval. Since the bit line pad 150 may be formed by patterning the conductive layer, a thickness of the second insulating layer 122 may be relatively thin compared to a semiconductor device according to a comparative example in which a bit line pad is formed in the channel hole C140H.

Figure 29:
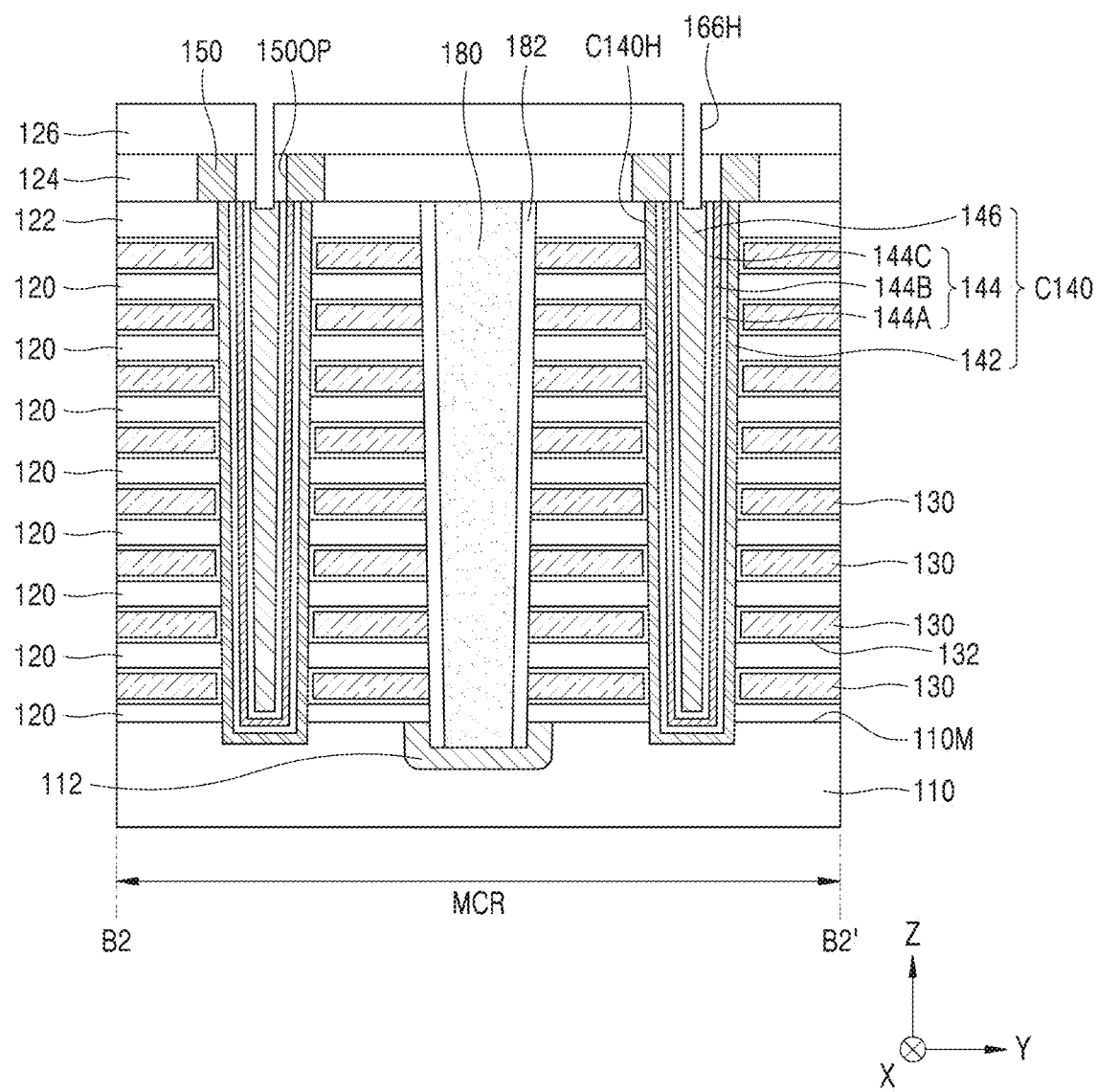

Referring to FIG. 29, a third insulating layer 124 may be formed on the bit line pad 150 and the second insulating layer 122, and then a planarization for a top surface of the third insulating layer 124 may be performed until a top surface of the bit line pad 150 is exposed. Thereafter, a fourth insulating layer 126 may be formed to cover the top surfaces of the third insulating layer 124 and the bit line pad 150. In some example embodiments, when the third insulating layer 124 may have a top surface disposed at a level higher than the top surface of the bit line pad 150, the planarization of the third insulating layer 124 may be omitted, in this case, the fourth insulating layer 126 may not be formed.

Thereafter, the bit line contact hole 162H (see FIG. 5) and the body gate contact hole 166H penetrating the third insulating layer 124 and the fourth insulating layer 126 may be formed. Then, the bit line contact hole 162H and the body gate contact hole 166H may be filled with a conductive material to form the bit line contact 162 and the body gate contact 166 in the bit line contact hole 162H and the body gate contact hole 166H, respectively.

Figure 30:
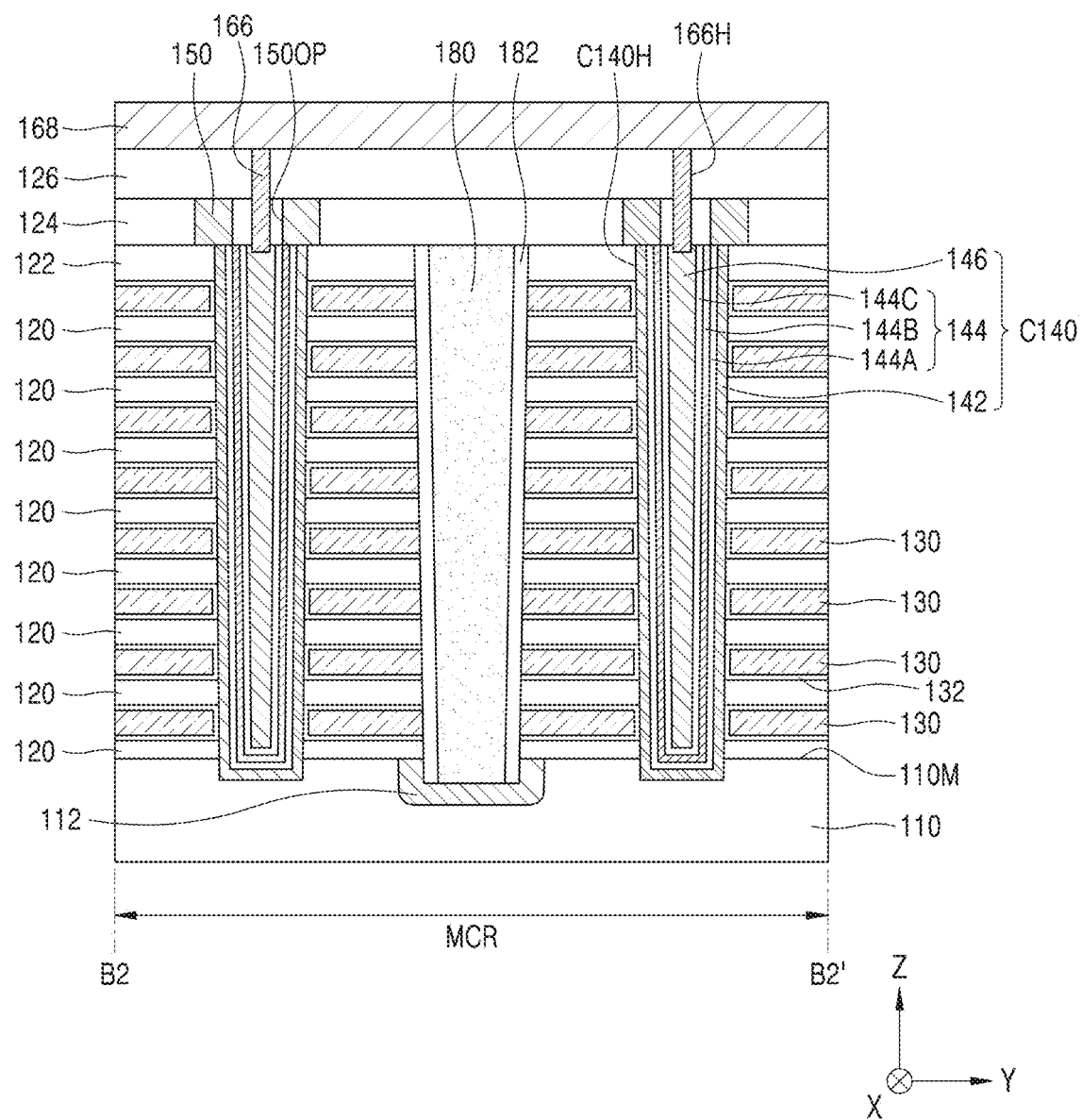

Referring to FIG. 30, the bit line 164 and the body gate line 168 respectively connected to the bit line contact 162 and the body gate contact 166 may be formed on the fourth insulating layer 126.

The semiconductor device 100 may be completed by performing the above-described processes.

In the semiconductor device according to the comparative example, the charge storage structure 144 (that is, the blocking dielectric layer 144C, the charge storage layer 144B, and the tunneling dielectric layer 144A) is first formed in the channel hole C140H, and then a portion of the charge storage structure 144 disposed at a bottom portion of the hole C140H is removed and then an anisotropic etching process or an etch back process is performed to expose a top surface of the substrate 110. Thereafter, the channel layer 142 is formed on an inner wall of the channel hole C140H. However, as the vertical height of the semiconductor device 100 increases, the aspect ratio of the channel hole C140H also increases, so that the difficulty of the anisotropic etching process or the etch back process with respect to the bottom portion of the channel hole C140H may be significantly increased. When the top surface of the substrate 110 is not sufficiently exposed at the bottom portion of some of the channel holes C140H (when the bottom portion of the charge storage structure 144 is partially removed), the electrical characteristics of the channel structure C140 formed in the channel hole C140H may not be excellent.

In addition, in the semiconductor device according to the comparative example, in order to obtain a low contact resistance between the channel structure C140 and the substrate 110, a cell contact may be formed by growing a semiconductor layer from the top surface of the substrate 110 exposed to the bottom portion of the channel hole C140H, by a selective epitaxial growth (SEG) process. However, it may be difficult to grow the semiconductor layer with a uniform height through the SEG process, and thus, the plurality of channel structures C140 are likely to have non-uniform electrical characteristics.

However, according to the method of manufacturing the semiconductor device 100 according to the example embodiments, a high difficulty manufacturing process as described above may be omitted by forming the channel layer 142 directly on the inner wall of the channel hole C140H. In addition, the difficulty of forming the bit line pad 150 may be reduced. Therefore, the semiconductor device 100 according to the example embodiments may be advantageous to increase the height in the vertical direction and to improve the degree of integration.

Figure 31:
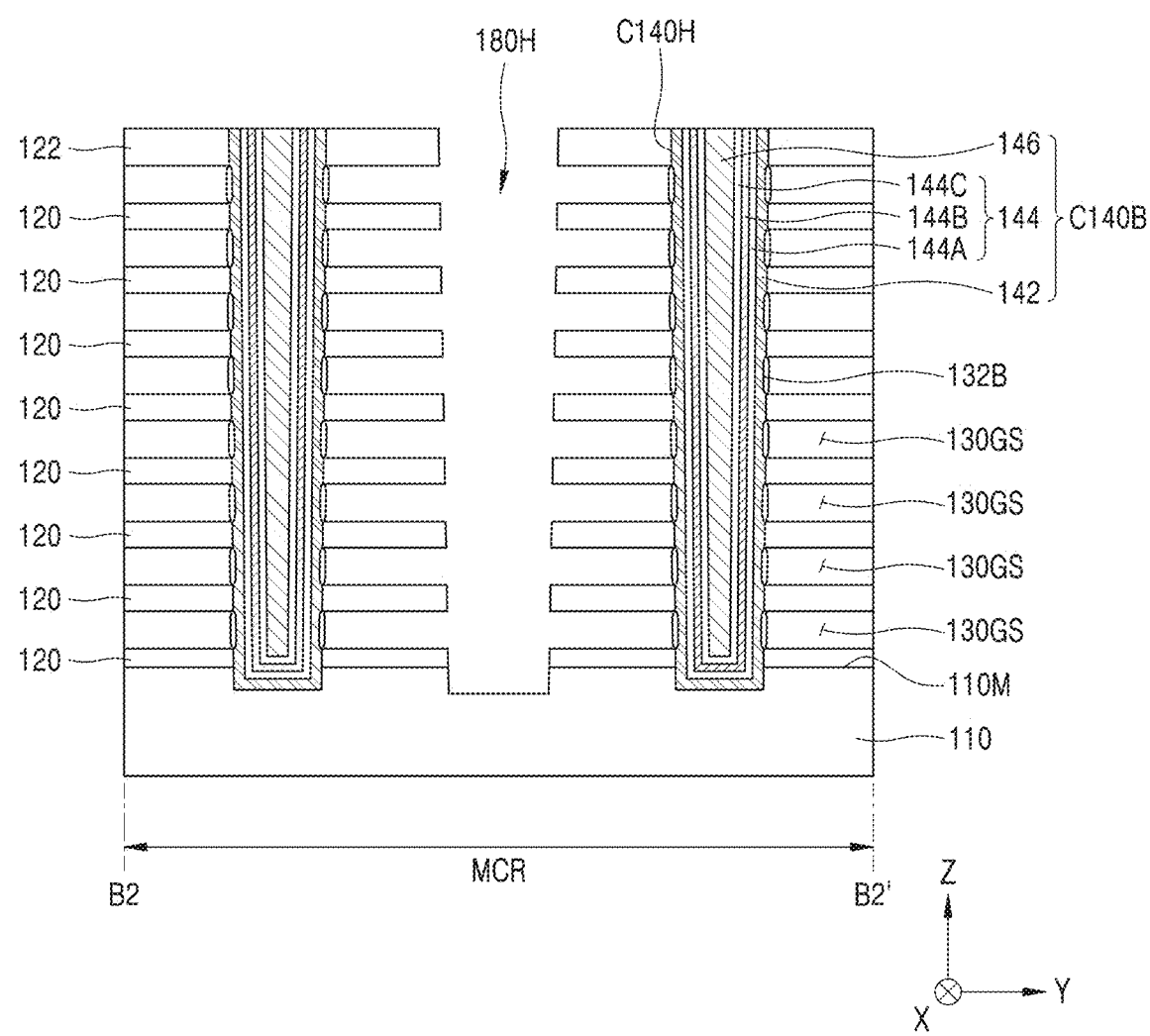
FIGS. 31 and 32 are schematic diagrams illustrating a method of manufacturing a semiconductor device according to some example embodiments, in a process sequence.
Figure 32:
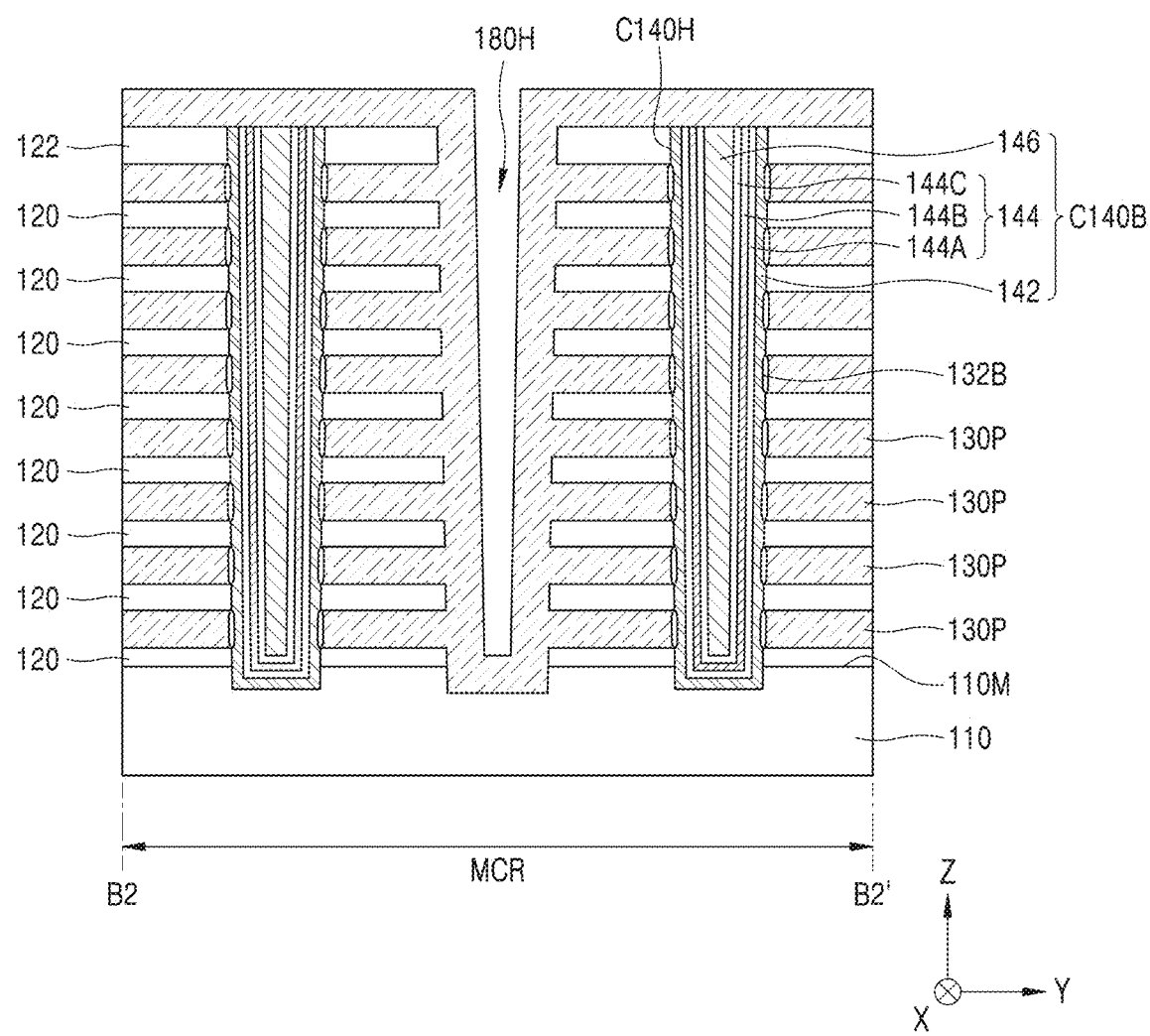

FIGS. 31 to 32 are schematic diagrams illustrating a method of manufacturing a semiconductor device 100B according to some example embodiments, in a process sequence.

First, the word line cut opening 180H and the plurality of gate spaces 130GS may be formed by performing the processes described with reference to FIGS. 21 to 25.

Referring to FIG. 31, a gate insulating layer 132B may be formed on a surface of the channel layer 142 exposed to the plurality of gate spaces 130GS.

In example embodiments, a process for forming the gate insulating layer 132B may be a thermal oxidation process, and a surface portion of the channel layer 142 may be converted to silicon oxide by the thermal oxidation process, and thus the gate insulating layer 132B may be formed. Meanwhile, the gate insulating layer 132B may not be formed on the top and bottom surfaces of the first insulating layer 120 exposed to the gate space 130GS. For example, the gate insulating layer 132B may include a thermal oxide layer formed in the thermal oxidation process, and may include silicon oxide.

Referring to FIG. 32, a preliminary gate electrode layer 130P may be formed on the word line cut opening 180H and the inner walls of the plurality of gate spaces 130GS.

Thereafter, the semiconductor device 100B may be completed by performing the processes described with reference to FIGS. 27 to 30.

Figure 33:
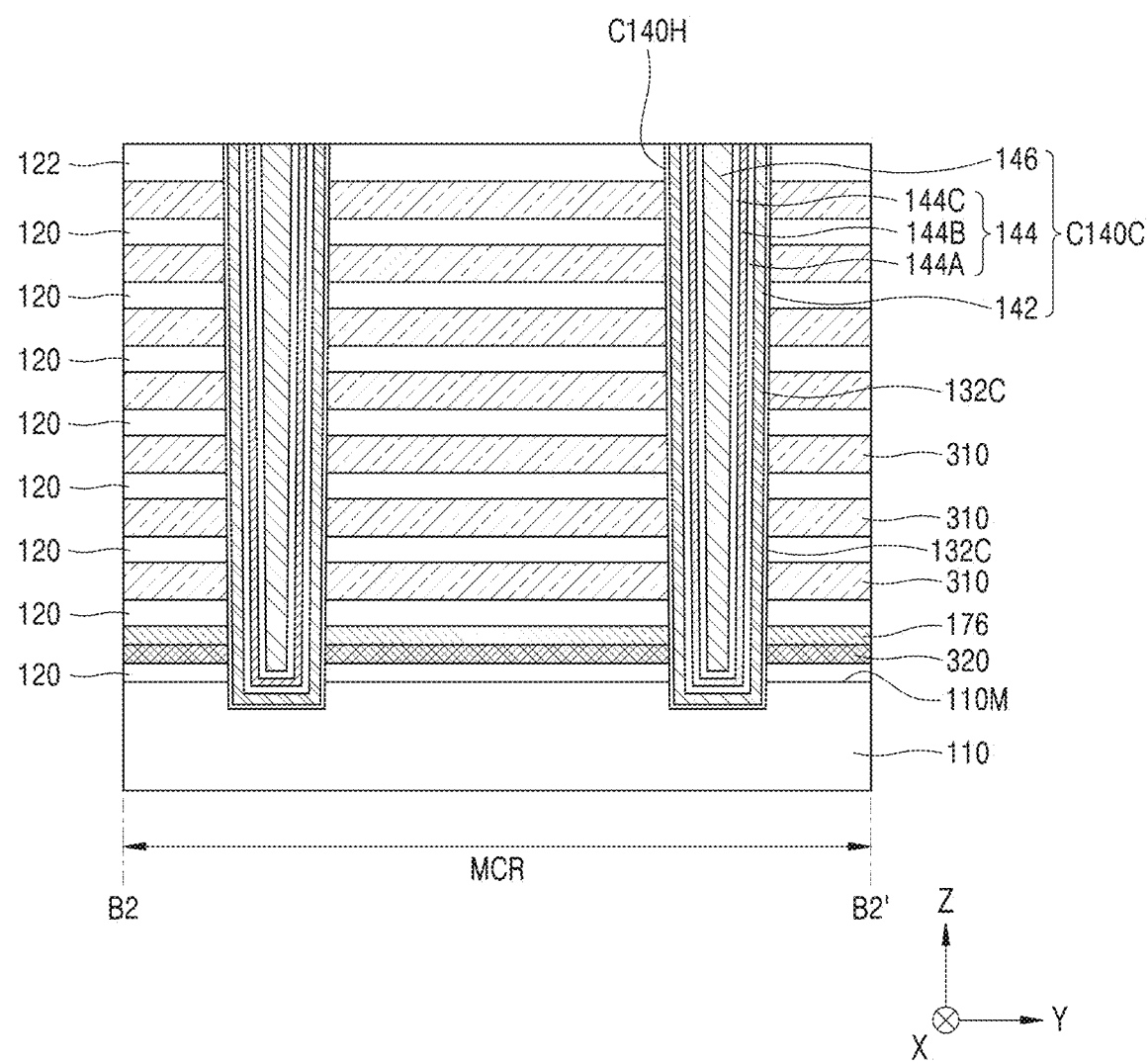
FIGS. 33 to 38 are schematic diagrams illustrating a method of manufacturing a semiconductor device according to some example embodiments, in a process sequence.
Figure 34:
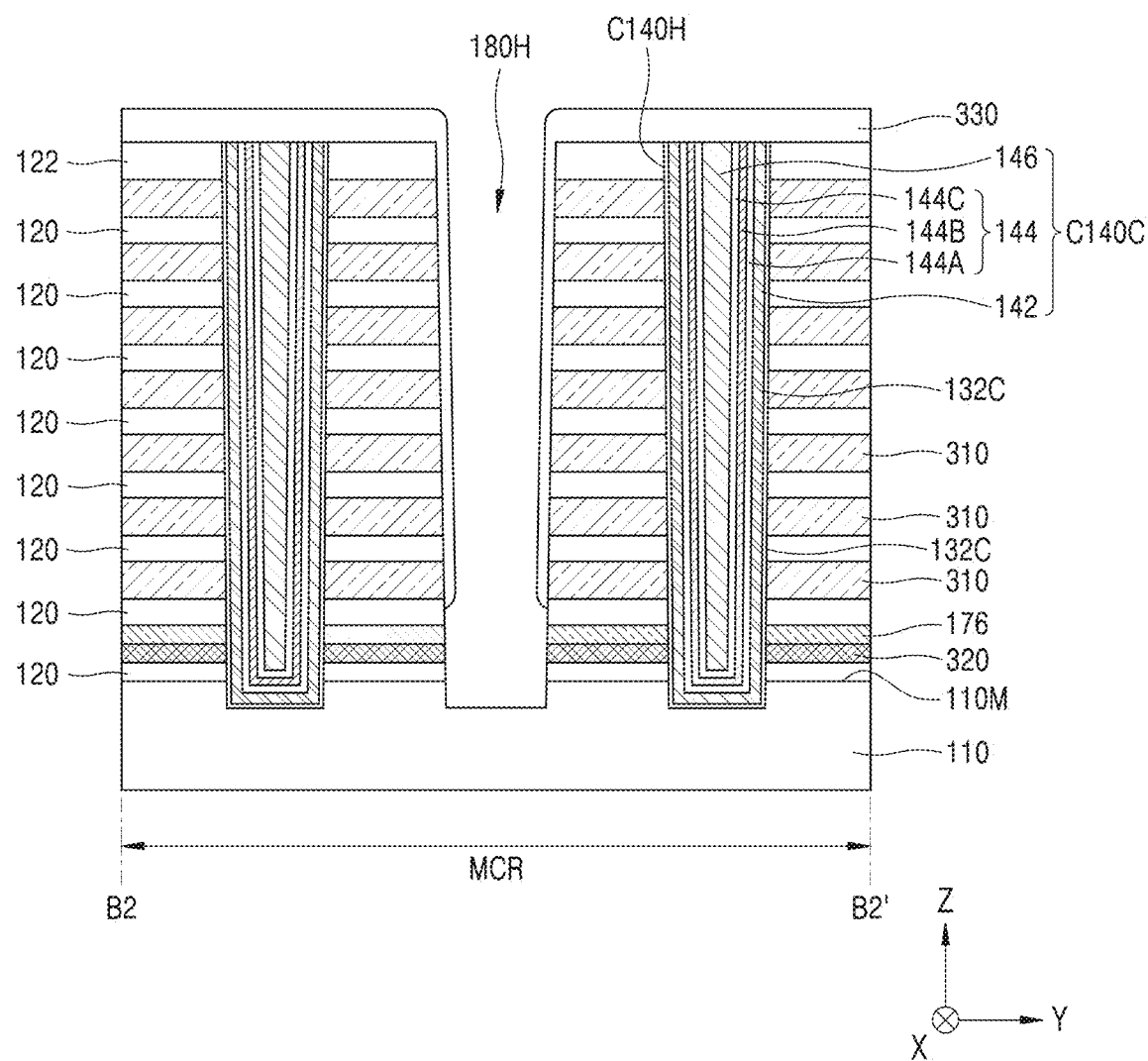
Figure 35:
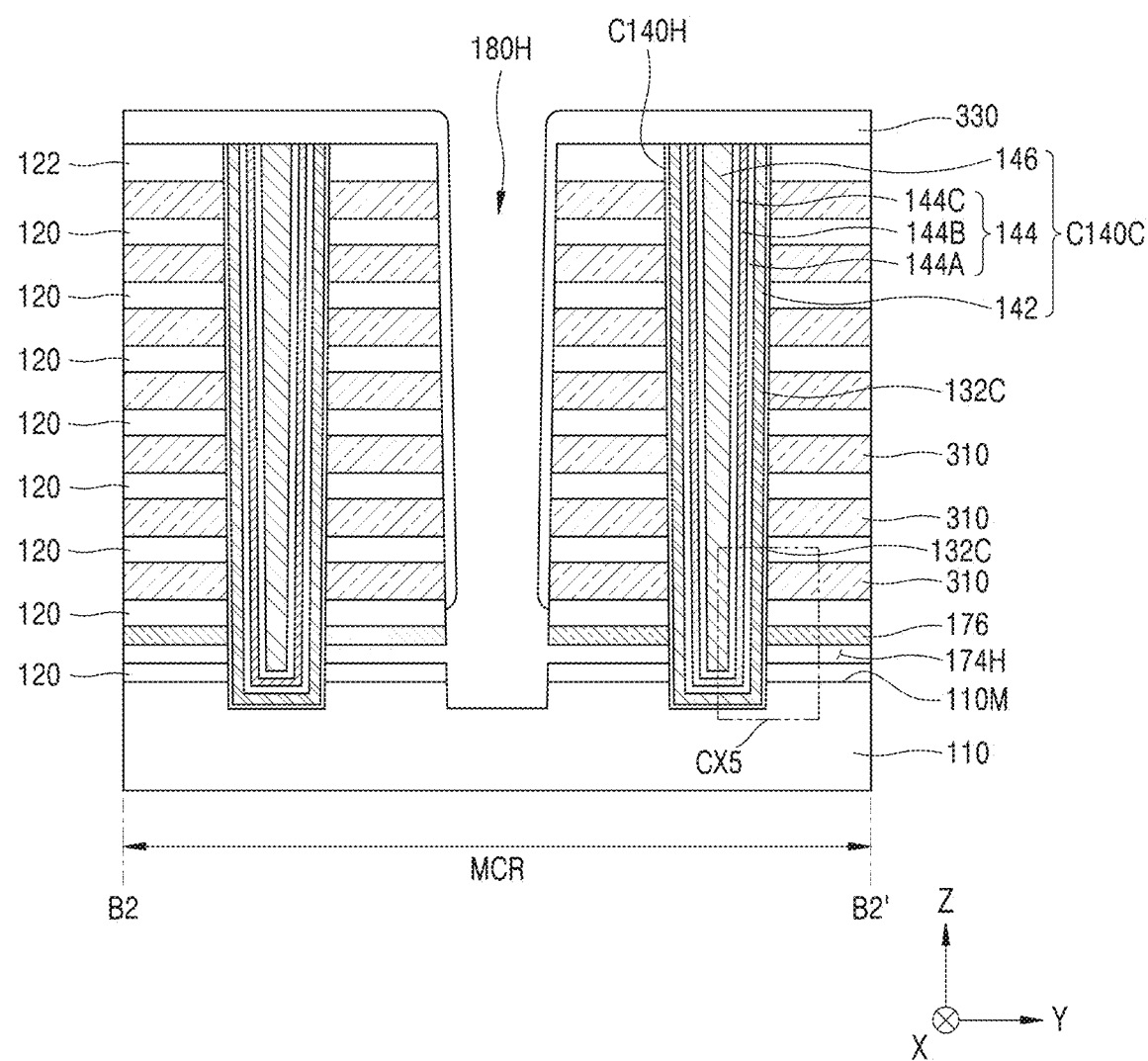

FIGS. 33 to 38 are schematic diagrams illustrating a method of manufacturing a semiconductor device 100C according to some example embodiments, in a process sequence. FIGS. 33 to 35 are cross-sectional views corresponding to the cross section taken along line B2-B2' of FIG. 2, and FIGS. 36 to 38 are enlarged cross-sectional views corresponding to a portion CX5 of FIG. 35.

Referring to FIG. 33, the first insulating layer 120 may be formed on the main surface 110M of the substrate 110, and then a lower sacrificial layer 320 and a second semiconductor layer 176 may be sequentially formed on the first insulating layer 120, and then a plurality of first insulating layers 120 and a plurality of sacrificial layers 310 may be alternately formed on the second semiconductor layer 176. The lower sacrificial layer 320 may include silicon nitride or silicon oxynitride, and the second semiconductor layer 176 may include doped polysilicon or undoped polysilicon.

Thereafter, portions of the plurality of the sacrificial layers 310, the plurality of first insulating layers 120, the second semiconductor layer 176, and the lower sacrificial layer 320 may be etched to form a channel hole C140H. A gate insulating layer 132C, a channel layer 142, a tunneling dielectric layer 144A, a charge storage layer 144B, a blocking dielectric layer 144C, and a body gate layer 146 may be sequentially formed in the channel hole C140H, and then a portion of the channel layer 142, the tunneling dielectric layer 144A, the charge storage layer 144B, the blocking dielectric layer 144C, and the body gate layer 146 formed on the second insulating layer 122 may be removed by performing the planarization process. Accordingly, the channel structure C140C may be formed.

Referring to FIG. 34, portions of the plurality of sacrificial layers 310, the plurality of first insulating layers 120, the second semiconductor layer 176, and the lower sacrificial layer 320 may be etched to form a word line cut opening 180H, and then a cover insulating layer 330 covering sidewalls of the word line cut opening 180H may be formed. In example embodiments, the cover insulating layer 330 may cover all sidewalls of the plurality of sacrificial layers 310 exposed by the word line cut opening 180H and may expose sidewalls of the lower sacrificial layer 320. For example, the cover insulation layer 330 may be formed using a material having poor step coverage characteristics, and thus the cover insulating layer 330 may not be formed on a lower portion of the word line cut opening 180H and the top surface of the substrate 110.

Figure 36:
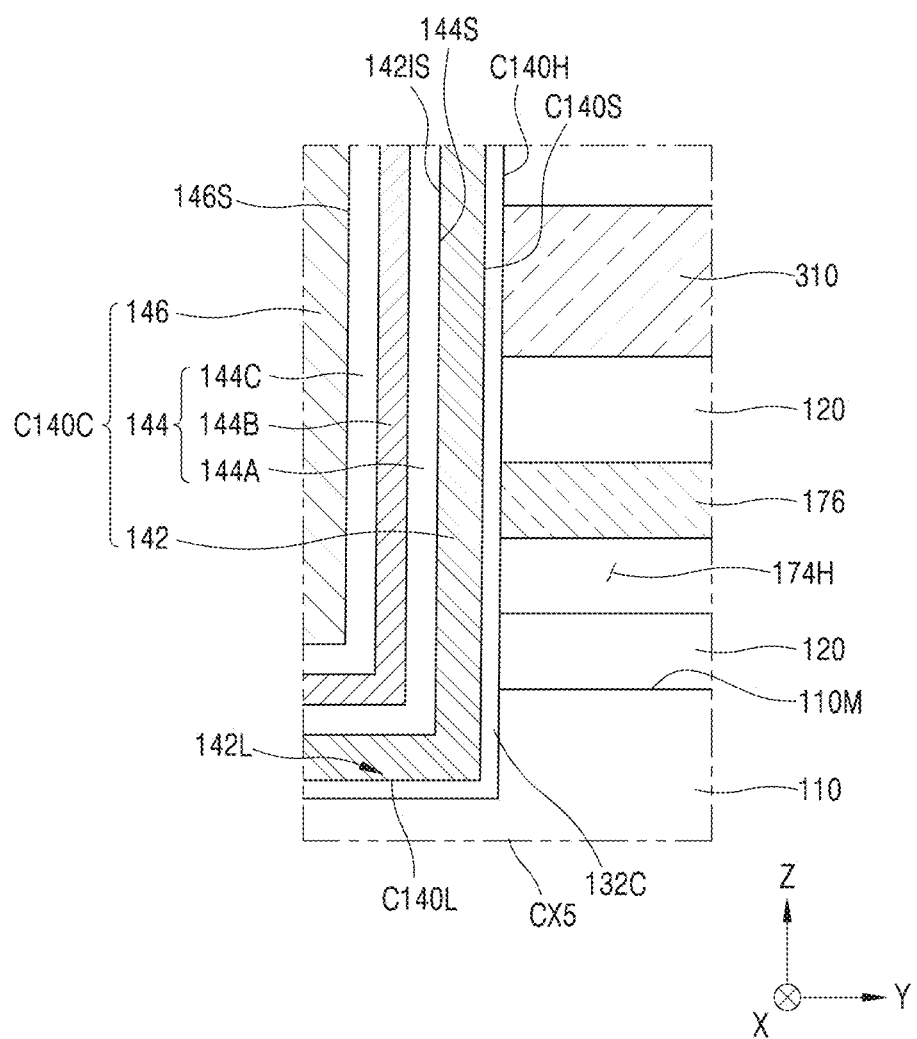

Referring to FIGS. 35 and 36, the lower sacrificial layer 320 (see FIG. 34) exposed to the lower portion of the word line cut opening 180H may be removed, and then a lower opening 174H may be formed at a position from which the lower sacrificial layer 320 is removed. Sidewalls of the gate insulating layer 132C may be exposed by the lower opening 174H. In example embodiments, the removing of the lower sacrificial layers 320 may be performed by a wet etching process using a phosphoric acid solution as an etchant.

Figure 37:
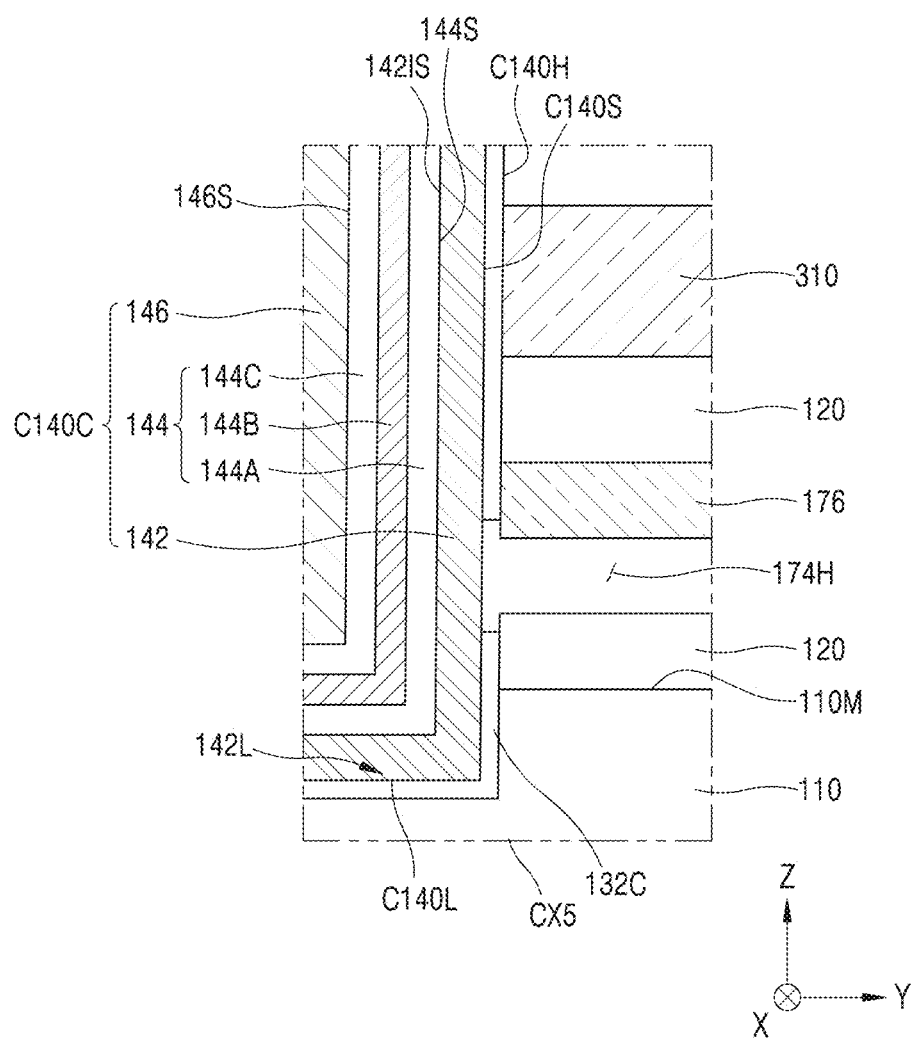

Referring to FIG. 37, a portion of the gate insulating layer 132C exposed by the lower opening 174H may be removed to expose sidewalls of the channel layer 142. The removing of the gate insulating layer 132C may be performed by a wet etching process. In the wet etching process, a portion of the gate insulating layer 132C between the channel layer 142 and the second semiconductor layer 176 may be exposed by the lower opening 174H and removed together, and a portion of the gate insulating layer 132C between the channel layer 142 and the lowermost first insulating layer 120 may be also exposed by the lower opening 174H and removed together. However, the inventive concept is not limited thereto.

Figure 38:
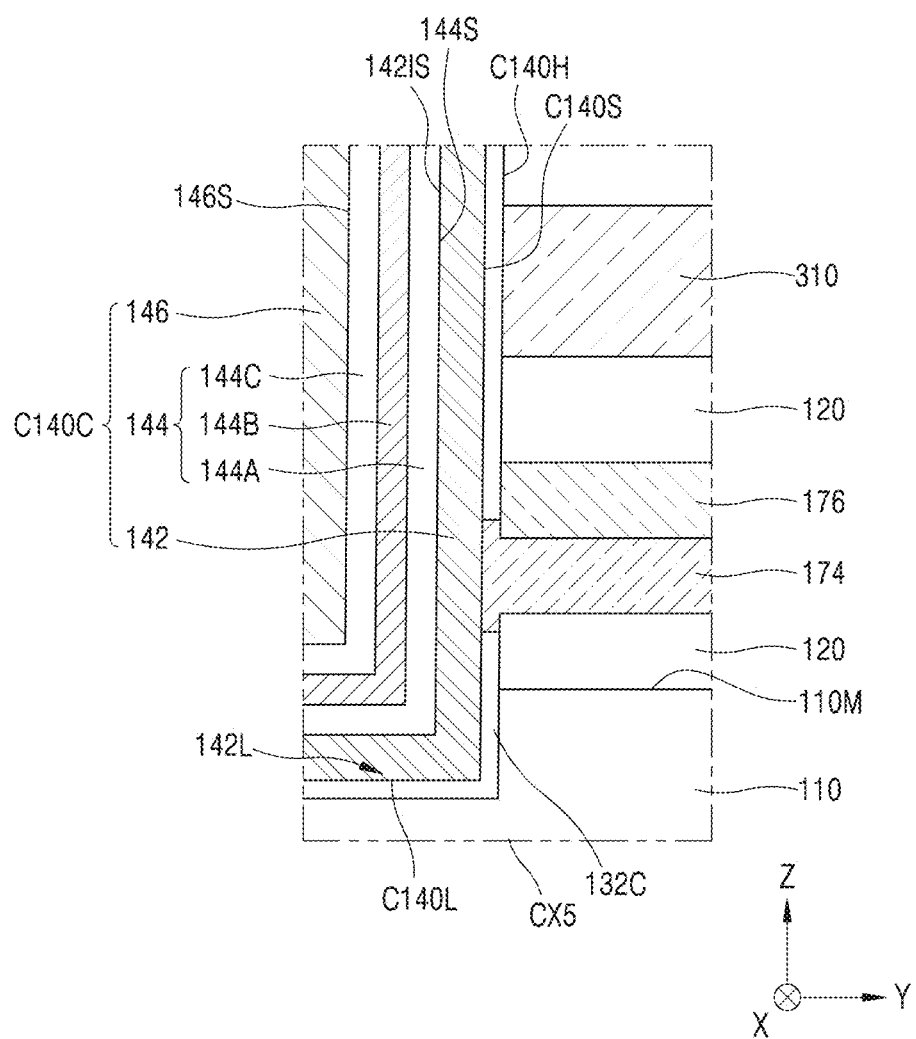

Referring to FIG. 38, a first semiconductor layer 174 may be filled in the word line cut opening 180H (see FIG. 35) and the lower opening 174H. The first semiconductor layer 174 may fill the inside of the lower opening 174H between the lowermost first insulating layer 120 and the second semiconductor layer 176, and may contact a sidewall C140S of the channel structure C140C.

Subsequently, a portion of the first semiconductor layer 174 formed on the inner wall of the word line cut opening 180H may be removed by the etch back process, and the top surface of the substrate 110 may be exposed again to the bottom portion of the word line cut opening 180H.

Thereafter, the plurality of sacrificial layers 310 (see FIG. 24) exposed by the word line cut opening 180H may be removed to form the plurality of gate spaces 130GS at the positions where the plurality of sacrificial layers 310 may be removed, and then the preliminary gate electrode layer 130P may be formed on the inner walls of the plurality of gate spaces 130GS.

Thereafter, the semiconductor device 100C may be completed by performing the processes described with reference to FIGS. 27 to 30.

As described above, example embodiments have been disclosed in the drawings and the specification. Although example embodiments have been described using specific terms herein, they are used only for the purpose of describing the inventive concept of the present disclosure and are not intended to limit the scope of the inventive concept as defined in the claims. Therefore, those skilled in the art will understand that various modifications and equivalent some example embodiments are possible from the example embodiments. Therefore, the true technical protection scope of the present disclosure will be defined by the inventive concept of the appended claims.

While the inventive concept has been particularly shown and described with reference to embodiments thereof, it will be understood that various changes in form and details may be made therein without departing from the spirit and scope of the following claims.

What is claimed is:

1. A semiconductor device comprising:
   a channel structure on a substrate and extending in a first direction perpendicular to a top surface of the substrate, the channel structure comprising
      a body gate layer extending in the first direction;
      a charge storage structure surrounding a sidewall of the body gate layer; and
      a channel layer surrounding a sidewall of the charge storage structure, an upper surface of the charge storage structure and an upper surface of the channel layer are at a same level;
   a plurality of gate electrodes on the substrate and spaced apart from one another in the first direction on a sidewall of the channel structure; and
   a gate insulating layer between each of the plurality of gate electrodes and the channel structure; and
   a body gate contact contacting the body gate layer; and
   a bit line contact being in electrical contact with the channel layer.

2. The semiconductor device of claim 1, wherein the charge storage structure is between the body gate layer and the channel layer, and
   the charge storage structure is in contact with an inner wall of the channel layer.

3. The semiconductor device of claim 1, wherein
   the channel layer is on an inner wall of a channel hole penetrating the plurality of gate electrodes and extending in the first direction,
   the charge storage structure is conformally along the inner wall of the channel hole on the channel layer, and
   the body gate layer fills in the channel hole on the charge storage structure.

4. The semiconductor device of claim 1, wherein the charge storage structure comprises:
   a blocking dielectric layer on the sidewall of the body gate layer,
   a charge storage layer on the blocking dielectric layer, and
   a tunneling dielectric layer on the charge storage layer and contacting the channel layer.

5. The semiconductor device of claim 1, wherein
   the channel layer includes a bottom portion in contact with the top surface of the substrate, and
   an entirety of a bottom surface of the charge storage structure is covered by the channel layer so that the bottom surface of the charge storage structure is not in contact with the substrate.

6. The semiconductor device of claim 1, further comprising
   a plurality of insulating layers, each between two adjacent gate electrodes of the plurality of gate electrodes,
   wherein the gate insulating layer covers top and bottom surfaces of each of the plurality of gate electrodes, and the plurality of insulating layers contact the sidewall of the channel structure.

7. The semiconductor device of claim 1, further comprising
   a plurality of insulating layers, each between two adjacent gate electrodes of the plurality of gate electrodes,
   wherein the gate insulating layer is only between each of the plurality of gate electrodes and the channel structure, and the plurality of insulating layers contact the sidewall of the channel structure.

8. The semiconductor device of claim 1, further comprising
a plurality of insulating layers, each between two adjacent gate electrodes of the plurality of gate electrodes,
wherein the gate insulating layer extends in the first direction along an entire length of the sidewall of the channel structure, and
the plurality of insulating layers do not contact the sidewall of the channel structure.

9. The semiconductor device of claim 1, further comprising:
a bit line pad at a level higher than an uppermost gate electrode of the plurality of gate electrodes, the bit line pad on the channel layer, wherein an inner wall of the bit line pad defines an opening;
the bit line contact connected to the bit line pad; and
the body gate contact penetrating the opening and connected to the body gate layer.

10. The semiconductor device of claim 9, wherein
the opening vertically overlaps the body gate layer in a plan view, and
the inner wall of the bit line pad surrounds the body gate layer.

11. The semiconductor device of claim 9, further comprising:
a bit line connected to the bit line contact and extending in a second direction parallel to the top surface of the substrate; and
a body gate line connected to the body gate contact, the body gate line extending in the second direction.

12. The semiconductor device of claim 1, wherein
a top surface of the body gate layer is at a same level as a top surface of the channel layer.

13. The semiconductor device of claim 1, wherein
a top surface of the body gate layer is at a level lower than a top surface of the channel layer.

14. The semiconductor device of claim 1, further comprising:
a conductive barrier layer between the body gate layer and the charge storage structure.

15. A semiconductor device comprising:
a plurality of gate electrodes on a substrate and spaced apart from one another in a first direction perpendicular to a top surface of the substrate;
a channel structure in a channel hole penetrating the plurality of gate electrodes and extending in the first direction, the channel structure comprising
a body gate layer extending in the first direction;
a channel layer on an inner wall of the channel hole; and
a charge storage structure on the channel layer on the inner wall of the channel hole, an upper surface of the charge storage structure and an upper surface of the channel layer are at a same level; and
a gate insulating layer between each of the plurality of gate electrodes and the channel layer, and the gate insulating layer covering a top surface and a bottom surface of each of the plurality of gate electrodes,
a body gate contact contacting the body gate layer; and
a bit line contact being in electrical contact with the channel layer,
wherein the channel layer is between each of the plurality of gate electrodes and the charge storage structure.

16. The semiconductor device of claim 15, wherein
the body gate layer filling an inside of the channel hole on the charge storage structure.

17. The semiconductor device of claim 16, further comprising:
a bit line pad at a level higher than an uppermost gate electrode of the plurality of gate electrodes and on the channel layer, wherein an inner wall of the bit line pad defines an opening;
the bit line contact connected to the bit line pad; and
the body gate contact penetrating the opening and connected to the body gate layer.

18. The semiconductor device of claim 17, further comprising:
a bit line connected to the bit line contact and extending in a second direction parallel to the top surface of the substrate; and
a body gate line connected to the body gate contact, the body gate line extending in the second direction.

19. The semiconductor device of claim 16, wherein
the charge storage structure is between the body gate layer and the channel layer,
the channel layer includes a bottom portion in contact with the top surface of the substrate, and
an entirety of a bottom surface of the charge storage structure is covered by the channel layer, so that the bottom surface of the charge storage structure is not in contact with the substrate.

20. A semiconductor device comprising:
a channel structure on a substrate and extending in a first direction perpendicular to a top surface of the substrate;
the channel structure comprising
a body gate layer extending in the first direction;
a charge storage structure surrounding a sidewall of the body gate layer; and
a channel layer surrounding a sidewall of the charge storage structure, an upper surface of the charge storage structure and an upper surface of the channel layer are at a same level;
a plurality of gate electrodes on the substrate and spaced apart from one another in the first direction on a sidewall of the channel structure;
a gate insulating layer between each of the plurality of gate electrodes and the channel structure;
a body gate contact contacting the body gate layer;
a bit line pad formed at a level higher than an uppermost gate electrode of the plurality of gate electrodes and on the channel layer;
a bit line contact connected to the bit line pad; and
a bit line connected to the bit line contact and extending in a second direction parallel to the top surface of the substrate.

* * * * *